(12) United States Patent
Shashoua

(10) Patent No.: US 6,373,340 B1
(45) Date of Patent: Apr. 16, 2002

(54) HIGH-EFFICIENCY AUDIO POWER AMPLIFIER

(75) Inventor: Meir Shashoua, Tel Aviv (IL)

(73) Assignee: K. S. Waves, Ltd., Tel Aviv (IL)

( * ) Notice: Subject to any disclaimer, the term of this patent is extended or adjusted under 35 U.S.C. 154(b) by 0 days.

(21) Appl. No.: 09/638,568

(22) Filed: Aug. 14, 2000

(51) Int. Cl.[7] .............................................. H03F 3/04
(52) U.S. Cl. ........................................ 330/297; 330/51
(58) Field of Search ........................ 330/2, 9, 51, 149, 330/297

(56) References Cited

U.S. PATENT DOCUMENTS

| | | | | |
|---|---|---|---|---|
| 4,574,250 A | * | 3/1986 | Senderowicz | 330/51 |
| 5,289,137 A | * | 2/1994 | Nodar et al. | 330/297 |
| 5,396,194 A | * | 3/1995 | Williamson et al. | 330/297 |
| 5,606,289 A | * | 2/1997 | Williamson | 330/297 |
| 5,914,638 A | * | 6/1999 | He | 330/258 |
| 6,011,440 A | * | 1/2000 | Bell et al. | 330/297 |

FOREIGN PATENT DOCUMENTS

| | | | | |
|---|---|---|---|---|
| WO | WO 97/49175 | 12/1997 | | H03F/1/38 |
| WO | WO 99/05806 | 2/1999 | | H04B/14/06 |

* cited by examiner

*Primary Examiner*—Robert Pascal
*Assistant Examiner*—Khanh Van Nguyen
(74) *Attorney, Agent, or Firm*—Fitch, Even, Tabin & Flannery

(57) ABSTRACT

A high-efficiency audio power amplifier featuring a tracking power-supply and an active noise shaping unit for reducing non-linearly and audible noise. Several variations of an non-inductive switched-capacitor tracking power-supply are presented, which are well-suited to integrated-circuit implementation and battery operation, and which provide an efficient power supply for the output stage over a wide range of voltages that can exceed the voltage limits of the main power source. The output of the tracking power-supply can be fed into an analog power stage, or can be used as a Multi-Level Quantizer for generating the output directly. A feedback and noise shaping allows the use of low-cost components while relaxing design constraints. Some simple switching strategies are disclosed which offer power efficiencies in excess of 80%.

18 Claims, 20 Drawing Sheets

HIGH-EFFICIENCY AUDIO POWER AMPLIFIER

FIELD OF THE INVENTION

The present invention relates to power amplifiers in general, and, more particularly, to high-efficiency audio power amplifiers, especially for battery-operated applications.

BACKGROUND OF THE INVENTION

A major problem associated with power amplifiers is inefficient use of electrical energy. Especially for audio applications, and more specifically in battery-operated portable audio applications, improving the efficiency of the power amplifier has major benefits in terms of performance as well as cost.

Most of the inefficiency of power amplifiers is a result of power dissipated within the power stage. The dissipated power is a function of the difference between the supply voltage and the output voltage of the power stage. In applications such as audio, where the peak-to-RMS ratio is high (about 12 dB), the peak dictates the supply voltage, but, most of the time the output voltage is significantly lower, and thus a significant amount of power is dissipated in the power stage.

Power dissipation (typical to class-A, AB, B, C, D, and Pulse Width Modulation (PWM), and/or output-of-band noise energy (typical to class D and PWM), is the main cause of inefficiency in prior art power amplifiers, and results in excessive electrical power consumption. The heat developed in the power stage must be dissipated, and the need to provide for adequate heat removal impacts the design and performance of integrated circuit components, and requires design compromises and special engineering expertise.

Further limiting factors associated with prior art power amplifies include limitations in their dynamic range (limited by the power-supply voltage), and their inability to achieve output over the full supply voltage range ("rail-to-rail" operation). Moreover, additional major problems in the design of existing power amplifiers include non-linearity and noise.

When designing a power amplifier, these factors—efficiency, linearity, dynamic range, and freedom from noise—conflict with one another, and optimizing the design to overcome one will compromise the design's ability to overcome the others.

It is already known in the art that by employing a tracking power-supply which minimizes the difference between the power-supply voltage provided to the power stage and the required output voltage of the power stage, that the dissipated power may be minimized. The minimizing action of a track power-supply is herein denoted by the terms "track" and "tracking", and is effected by providing a target function for determining the output of the tracking power-supply. The arguments of the target function may include the input signal to the power amplifier as well as the internal input to the power stage. There are, however, difficulties in implementing a tracking power-supply that is in itself efficient and suitable for a given application. For example, in the prior art are known tracking power-supplies which are based on switched L-C circuits. Because L-C circuits are reactive and store rather than dissipate energy, such tracking power-supplies are efficient. Unfortunately, the inductors of L-C circuits are not suitable for use with integrated circuits, and therefore such prior-art tracking power-supplies are not useful in applications involving miniaturized and/or battery-operated equipment.

There is thus a widely recognized need for, and it would be highly advantageous to have, a high-efficiency power amplifier with linear response, low noise, and with a wide dynamic range. These goals are met by the present invention.

REFERENCES

[1] EP0998795, WO9905806 "Method and apparatus for performance improvement by qualifying pulses in an oversampled, noise-shaping signal process"

[2] EP0906659, WO09749175 "Oversampled, noise-shaping, mixed-signal processor"

[3] "Relationships between Noise Shaping and Nested Differentiating Feedback Loops", by J. Vanderkooy, and M. O. J. Hawksford, *Journal of the Audio Engineering Society*, Vol. 47, No. 12, December 1999.

TERMS AND DEFINITIONS

Tracking Power-Supply—A power-supply capable of providing a variable output voltage to suit the needs of a power amplifier. According to the present invention, an efficient tracking power-supply is implemented, having control logic controlling a network of switched capacitors. By controlling the switches, different network connections can be made, giving rise to different electrical circuits. This allows creating multiple supply voltages with high efficiency at the load terminals, and monitoring voltages through the sensor terminals.

Multi-Level Quantizer—The above tracking power-supply can be viewed as a quantizer (a "multi-level quantizer") with multiple output levels possible during different time intervals, where the level changes during each time interval according to the voltages on the capacitors.

Network of Switched Capacitors—the network of switches and capacitors used in the tracking power-supply.

Network Connection—This is a specific set of connections, created by controlling the switches of the network of switched capacitors. This set of network connections creates an electrical circuit involving some or all of the capacitors, supplies, load terminals and sensor terminals.

Network State—The state of the network of switched capacitors at a certain time. The voltages across the capacitors define the network state.

I-Bit State—a specific case of a network state where a 1-bit state per capacitor indicates whether the voltage over it is higher or lower than some target voltage. This is useful when implementing the target capacitors selection algorithm.

Sensor—A sensor is any means of monitoring the network state while causing minimal affect. To monitor voltage over a certain capacitor, an appropriate network connection can be made by the control logic. A sensor for the 1-bit state can be the output of a comparator, comparing the voltage over the capacitor to the target voltage.

Estimated Network State—An estimated network state is a network state where some or all of the capacitor voltages are estimated rather than directly monitored.

Network Parameters—The network parameters include sufficient information about components involved in the work of switched capacitors. By way of example, this information may include electrical parameters of the load and main supplies, the capacitance of each capacitor, and the time intervals, whether absolute or relative. In certain embodiments of this invention, the control logic may need to known network parameters in order to estimates, or predict, the estimated network state when direct monitoring is not feasible. The network parameters may be supplied to the control logic, or may be measured by the control logic through the sensor, whether during initialization time, during operation, or both.

Time Interval—A period of time during which the network connection is held fixed. The duration of such time intervals may be constant or variable, depending on the application.

Load Time Interval—A time interval during which the network connection involves the tracking power-supply output terminals.

Monitoring Time Interval—A time interval during which monitoring of the network state can be performed. A monitoring time interval can overlap a load time interval.

Control Logic—Logic controlling the network of switched capacitors via the switches, in order to create a desired network connection. The main task of the control logic is to determine the best network connection involving the load at any time interval. The control logic implements a selection algorithm, and attempts to minimize the value of the target function, while conforming to some other criteria. The control logic may be implemented fully in the digital domain, while monitoring the state of the network of switched capacitors through the sensor. Alternatively, the control logic can be implemented in the analog domain. The control logic unit has one or more inputs and one or more control outputs.

Target Function—At each load time interval, there is an ideal desired output from the track power-supply. Since in general the tracking power-supply cannot provide this output exactly, the target function is a 'cost' function that associates a cost with each possible output from the tracking power-supply during the current load time interval. The control logic uses this function as part of the selection algorithm to determine the best network connection for the current load time interval.

Selection Algorithm—The selection algorithm applied by the control logic tries to minimize the target function, while applying additional considerations as well. Such considerations can be of different natures, including, without limitation, minimizing the number of switching operations taking place, keeping voltages on capacitors within certain ranges, keeping voltages on capacitors close to a target voltage, maintaining certain characteristics of the power stage, and so forth.

Constrained Capacitors—A selection algorithm according to which each capacitor has a target voltage range, and where the capacitor is not allowed to be connected such that it would charge when the voltage across it is above its target voltage range, and vice versa.

Targeted Capacitors—A selection algorithm according to which each capacitor has a target voltage, and where the capacitor is not allowed to be connected such that it would charge when the voltage across it is above its target voltage, and vice versa.

Target Error—The error, in the case of the targeted capacitor selection algorithm, of the actual average voltage supplied by a capacitor during a load time interval relative to that capacitor's target voltage.

Power Stage—The final stage of the power amplifier. Embodiments of the present invention describe a linear power stage and a discrete power stage.

Linear Power Stage—A power according to the present invention having a linear-analog power stage, where the power-supply is a tracking power-supply. The advantage of this approach is that the PSRR (Power Supply Reduction Ratio) that is an inherent feature of a linear analog power stage, reduces the noise generated by the tracking power-supply at the final output.

Discrete Power Stage—A power amplifier according to the present invention having no analog power stage, where the tracking power-supply is connected directly to the power amplifier output, and acts as a Multi-Level Quantizer. In this approach, the noise-shaping loop handles all noise. No linear-analog power components are used, and this is an advantage in certain cases.

Noise-Shaping Loop—A feedback and filtering network that causes the noise energy (whether non-linear errors correlated with the input, or uncorrelated noise) to reside in frequencies where the noise poses no problem. In the audio case, the power amplifier noise energy is shaped into high, inaudible frequencies. In one embodiment of the present invention, the noise-shaping loop may be implemented entirely in the analog domain, around the power stage. Alternatively, in another embodiment of the present invention, the noise-shaping loop may be implemented entirely in the digital domain before the power stage, based on information supplied by the control logic. In yet another embodiment, the noise-shaping loop may be implemented as a hybrid digital-analog domain using an A-to-D converter to convert analog feedback from the output of the power stage into the digital domain.

SUMMARY OF THE INVENTION

The main goal of the present invention is to improve the efficiency performance of power amplifiers, in order to reduce electrical power consumption. Another goal is to reduce the impact of critical factors on the design of power amplifiers, and allow for more tradeoffs regarding different parameters typical of power amplifiers such as dynamic range, signal-to-noise ratio, and harmonic distortion. Another goal is to improve the efficiency of DC-to-DC converters and tracking power supplies.

According to the invention, a non-linear, switching-type tracking power-supply is used to eliminate most of the power dissipation, as well as to increase the supply voltage (and thus the dynamic range) to the power stage by utilizing voltage multiplication techniques. A novel aspect of the present invention is the use of an integral feedback control and noise-shaping unit to correct the switching noise, common mode noise and the non-linearity introduced by such a power-supply. This innovation allows utilizing a tracking power-supply that is easy to design as well as inexpensive to manufacture and use, and which is well-suited for integrated circuitry, but which may otherwise normally exhibit an excessive amount of inherent noise. One embodiment of the present invention uses a linear power stage for which supply voltage is taken from a tracking power supply to significantly decrease power dissipation within the power stage. Another embodiment of the present invention uses a discrete power stage, where the final power amplifier output is taken directly from the tracking power supply. Yet another embodiment of the present invention uses the tracking power supply as a high efficiency DC-to-DC converter.

FIG. 1 is a general block diagram illustrating the basic configuration of a linear power stage power amplifier according to the present invention. A primary power source 102 is the source of DC electrical energy, having a positive output $V_{dd}$ 102-A and a negative output $V_{ss}$ 102-B, which feed into a tracking power-supply 104. Tracking power-supply 104 receives control input from a noise shaper 106 via a control output 106-B, as well as from an input 106-D and an input 106-E from an output 106-C of the noise shaper 106. Tracking power-supply 104 provides a positive supply voltage V+ 104-A and a negative supply voltage V− 104-B to a power stage 108, with power output terminals 108-A (L+) and 108-B (L−), which output an amplification of an input signal 110 at an input 106-A. There is at least one supply voltage involved (which is the voltage furnished to power stage 108), and the illustration herein of a positive supply voltage and a negative supply voltage is as a non-limiting example. In another embodiment, a single supply voltage can be utilized in conjunction with a point at a common or ground potential. Where two distinct supply voltages are utilized (such as a positive supply voltage and a negative supply voltage), the term "supply voltage" wherein denotes the voltage difference between these two distinct supply voltages. In another embodiment, the polarity of the positive and negative can also be interchanged in order to also create a negative voltage difference between these two distinct supply voltages. In a similar manner, primary power source 102 is illustrated in this non-limiting example as having positive output $V_{dd}$ 102-A and negative output $V_{ss}$ 102-B, but it is also possible to output a single source voltage relative to a point at a common or ground potential, and, where there are distinct source voltages for both a positive output $V_{dd}$ and a negative output $V_{ss}$, the difference between these two distinct voltages is referred to as the "source voltage". As noted previously, noise shaper 106 provides feedback control of tracking power-supply 104 via an output feedback 122 from a differential amplifier 120 to minimize the affect of noise and non-linearity at output 108-A and 108-B. Also, power stage 108 receives an internal input 106-F from noise shaper 106. The input signals from noise shaper 106 help in predicting the required tracking target function. An output load 112 represents the driven audio load, such as a loudspeaker, and in general may be a combination of resistive and possibly reactive elements. An important criterion of power amplifier operation is how closely the output of the power amplifier matches a specified transform of the input signal. The simplest and generally most-desired such transform is that of a multiplicative constant over a specified frequency range, herein denoted as the "amplification" K. The difference between the actual output and the transform is herein denoted as the "error" of the power amplifier.

A general reference for noise shaping loops in both the analog and digital domains is [3].

As is known in the art, the use of feedback can reduce non-linear behavior of an output circuit by applying a feedback from output to input and invert the non-linear behavior. In addition to reducing non-linearity through the use of feedback, the noise shaper also reduces the uncorrelated audible noise of the output signal. It is known in the art that through the use of an auditory sensitivity filter a noise shaper can shift the frequency spectrum of the uncorrelated noise away from the audio spectrum to higher, substantially non-audible frequencies (the process of "noise-shaping"), so that the noise cannot be heard. In this fashion the noise shaper is able to minimize the audible error of the power amplifier.

Another new aspect of the present invention is the use of a novel switched-capacitor tracking power-supply which does not rely on inductors, and is therefore ideal for integrated-circuit use. Variations in the design of the network of switched-capacitors allow the creation of both positive and negative output voltage to double the dynamic range, and also the creation of an output voltage whose absolute value is higher than that of the power supply voltage to further increase the dynamic range.

FIG. 2 shows a basic switched-capacitor tracking power-supply 104 according to the present invention. A capacitor bank 202 has a number of capacitors, illustrated as capacitors 202-A, 202-B, 202-C, 202-D, and 202-E, for storing electrical energy. Any reasonable number of capacitors may be employed. The capacitors do not have to be of the same value. In one embodiment, as shown in FIG. 2, capacitors 202-A, 202-B, 202-C, 202-D, and 202-E are connected in common on one side to $V_{ss}$ 102-B. A V+ selector 204 is connected individually to the other sides of capacitors 202-A, 202-B, 202-C, 202-D, and 202-E via lines 205-A, 205-B, 205-C, 205-D, and 205-E, respectively. In addition, $V_{dd}$ 102-A and $V_{ss}$ 102-B are also inputs to V+ selector 204. In this manner, V+ selector 204 can selectively connect $V_{dd}$ 102-A, $V_{ss}$ 102-B or one side of any one of capacitors 202-A, 202-B, 202-C, 202-D, or 202-E to supply voltage terminal V+ 104-A. Likewise, a V− selector 206 is also connected to the other sides of capacitors 202-A, 202-B, 202-C, 202-D, and 202-E via lines 205-A, 205-B, 205-C, 205-D, and 205-E, respectively. In addition, $V_{dd}$ 102-A and $V_{ss}$ 102-B are also input into V− selector 206. Thus, V− selector 206 can selectively connected $V_{dd}$ 102-A, $V_{ss}$ 102-B or one side of any one of capacitors 202-A, 202-B, 202-C, 202-D, or 202-E to supply voltage terminal V− 104-B. In this specific example the possible voltage that can be generated across V+ and V− terminals include: 0, ±($V_{dd}$−$V_{ss}$), ±($V_{dd}$−$V_{ss}$−$C_n$), ±($C_n$), ±($C_n$−$C_m$), where $C_n$ and $C_m$ are the voltages on the respective capacitors. A control logic unit 208 controls V+ selector 204 via a control lines 208-A and V− selector 206 via a control line 208-B so that V+ selector 204 and V− selector 206 are respectively connected to different input lines (lines 205-A, 205-B, 205-C, 205-D, 205-E, $V_{dd}$ 102-A, and $V_{ss}$ 102-B) according to the desired output voltages V+ 104-A and V− 104-B and the voltages available on capacitors 202-A, 202-B, 202-C, 202-D, and 202-E, along with $V_{dd}$ 102-A, and $V_{ss}$ 102-B. An optional voltage sensor 210 monitors the voltages on lines 205-A, 205-B, 205-C, 205-D, and 205-E, and reports the respective voltages thereon to control unit 208. An optional current sensor 212 monitors a current $I_{in}$ 216 at voltage V− 104-B, and reports this current to control logic 208. Because current $I_{in}$ 216 is equal to a current $I_{out}$ 214, current sensor 212 could also be located in other positions within the circuit. Note that at any given time, both V+ selector 204 and V− selector 206 are characterized by respective states according to the selection. State information is taken into account by control logic 208 to determine the network connection.

As noted, feedback control via noise shaper 106 around power stage 108 (FIG. 1) serves as a control system to reduce non-linearity, as well as a noise-shaping filter to control the distribution of noise energy across the spectrum. This allows for much greater flexibility for optimizing the previously-cited design factors, since the non-linearity and noise generated in the power stage can be corrected by this feedback control and noise-shaping unit.

Therefore, by employing a switched-capacitor tracking power-supply and a noise shaper, the present invention allows the use of low-cost, high-efficiency power components, while still achieving noise free linear power output regardless of noise and non-linearity which might be inherent in the components.

Discrete Power Stage

Another aspect of the invention uses the tracking power supply itself to drive the power amplifier output directly, rather than acting as a power supply for a linear power stage, thus creating a discrete power stage. As is well-known in the art, pulse-width-modulation (PWM) and class-D (digital) power amplifiers are based on power switches that toggle the output between two voltages. In general, there technologies generates an over-sampled 1-bit signal using a variety of noise shaping and pulse-width-modulation techniques, and then use a power switch as the power stage to drive a load with this 1-bit signal. An amplifier operating according to such principles can be viewed as a one-bit quantizer with noise-shaping. The quantizer generates quantization noise with amplitude of 0.5 bit. That is, at least 0.5 of the energy output by the power stage is noise. For audio applications, noise-shaping techniques ensure that the quantization noise resides above the audio spectrum at inaudible frequencies (typically above 20Khz). Such general techniques are herein denoted by the term "one-bit quantizer".

There are three major factors causing inefficiency in such one-bit quantizer systems.

The first factor is the energy of the noise itself. Although this noise is inaudible, it is still produced by the output power stage. This energy can be removed from the output signal by filtering, but unless the filter used is a reactive filter, this noise energy will be dissipated as heat. In systems where other than a reactive filter is used, the efficiency is limited.

In systems where a reactive L-C low-pass filter is used, the energy is not wasted, but rather is recycled by the inductors and capacitors. Unfortunately, L-C networks are relatively bulk and generate significant electromagnetic interference (EMI), and thus are not practical to use in many applications, especially portable audio appliances where efficiency is critical.

The other factors that reduce efficiency in such amplifiers a related to imperfections in the power switch. Parasitic capacitance and finite rise and fall times in the power switch cause loss of energy associated with each toggle of the output voltage from one state to another. This loss of energy is proportional to the voltage difference across the switch at the time of the toggle, to the rise/fall times of the switch and to the switching frequency. Most of the energy loss is due to energy dissipation during the rise/fall period of the switch, when the product of the voltage over the switch and the current through it is not close to zero.

Therefore, the high switching frequency associated with one-bit quantizer systems is another factor leading to inefficiency. Due to the excessive amount of noise energy, a high degree of over-sampling to required, and this leads to a high switching frequency.

The fact that the voltage difference at the time of each toggle is extreme, from $V_{ss}$ to $V_{dd}$, further increases the energy losses. Some prior art techniques address this problem by trying to reduce the number of switching transitions that take place, as is disclosed, for example, in reference [1].

According to the present invention, replacing the one-bit quantizer of current technologies with a Multi-Level Quantizer, can significantly reduce the effects of all of the above factors, and thereby dramatically increase the efficiency of power amplifiers based on switching principles.

The energy of quantization noise output from a Multi-Level Quantizer is proportional to one-half the average difference between levels. Depending on the number of levels in the Multi-Level Quantizer, this noise energy can be significantly less than that of a one-bit quantizer. Furthermore, because there is less noise energy in the signal, the amount of over-sampling required to reach the same noise performance is greatly reduced, and thus the switching frequency and energy losses are reduced. Moreover, because the voltage across each switch during the switching transition time is much smaller for a Multi-Level Quantizer compared with a one-bit quantizer, the average energy loss associated with switching is reduced. (Typically, this is the average voltage difference between two adjacent levels, versus the full range of $V_{dd}$ to $V_{ss}$).

In order to implement a Multi-Level Quantizer, it is necessary to generate multiple voltage levels. According to the present invention, an efficient way to generate multiple voltages from one power supply is by using the same network of switched capacitors as in the tracking power-supply previously described. The target function for the control logic in this case is simply to produce the level closest to the signal at the input of the Multi-Level Quantizer. Other constraints can be added in the control logic, as will be described below by way of a non-limiting example regarding the Constrained capacitor or targeted capacitors selection algorithms.

Therefore, according to the present invention thee is provided a power amplifier receiving electrical energy from a primary source of electrical energy having a $V_{ss}$ source voltage and a $V_{dd}$ source voltage, the power amplifier receiving an input signal via input terminals and supplying a power output signal via load terminals, the power amplifier including a network of switched capacitors containing at least one capacitor for storing electrical energy, each of the capacitor having a voltage thereon, wherein the network of switched capacitors is operative to configuring electrical circuits between the load terminals, and wherein the electrical circuits include voltages and components selected from a group containing (a) and $V_{ss}$ source voltage, (b) the $V_{dd}$ source voltage, and (c) a non-negative number of capacitors of the network of switched capacitors.

BRIEF DESCRIPTION OF THE DRAWINGS

The invention block diagram is herein described, by way of example only, with reference to the accompanying drawings, wherein.

DESCRIPTION OF THE PREFERRED EMBODIMENTS

The principles and operation of a power amplifier according to the present invention may be understood with reference to the drawings and the accompanying description.

In some of the following embodiments, the combination of the tracking power-supply, and specifically the type of tracking power-supply described herein, with the feedback control and noise-shaping unit around the power stage is essential. Otherwise the switching noise and common mode noise created by the tracking power-supply can be unacceptable.

Switched-Capacitor Tracking Power-Supply

Figure 1:
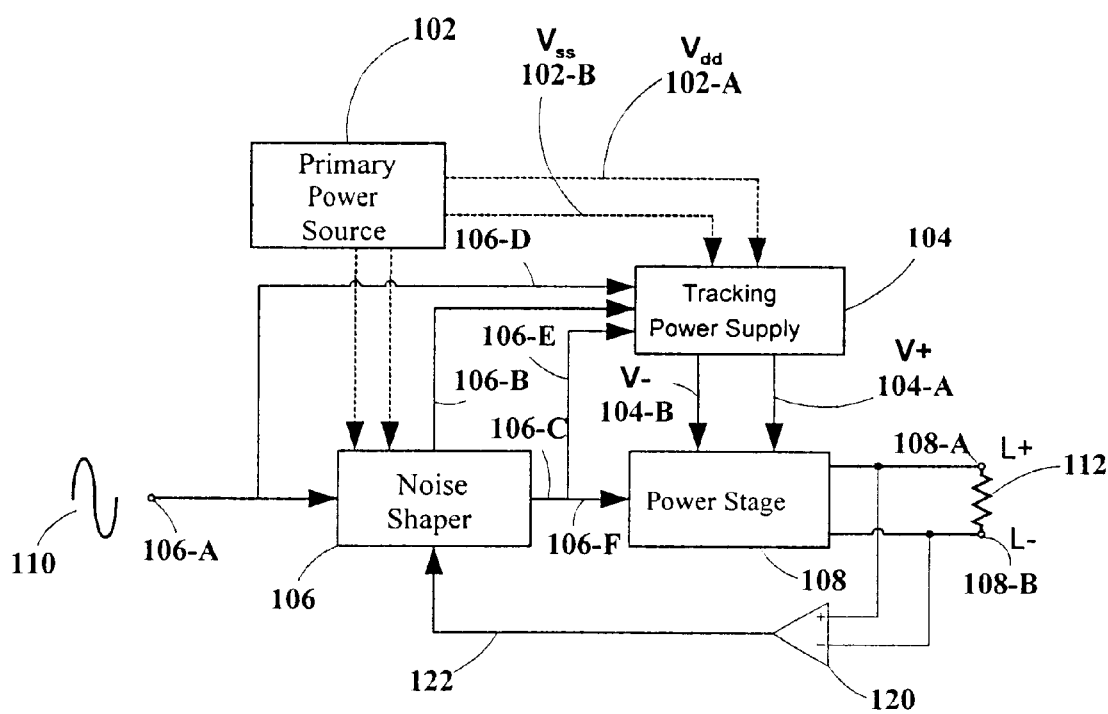
FIG. 1 shows a general block diagram of a power amplifier according to the present invention.
Figure 2:
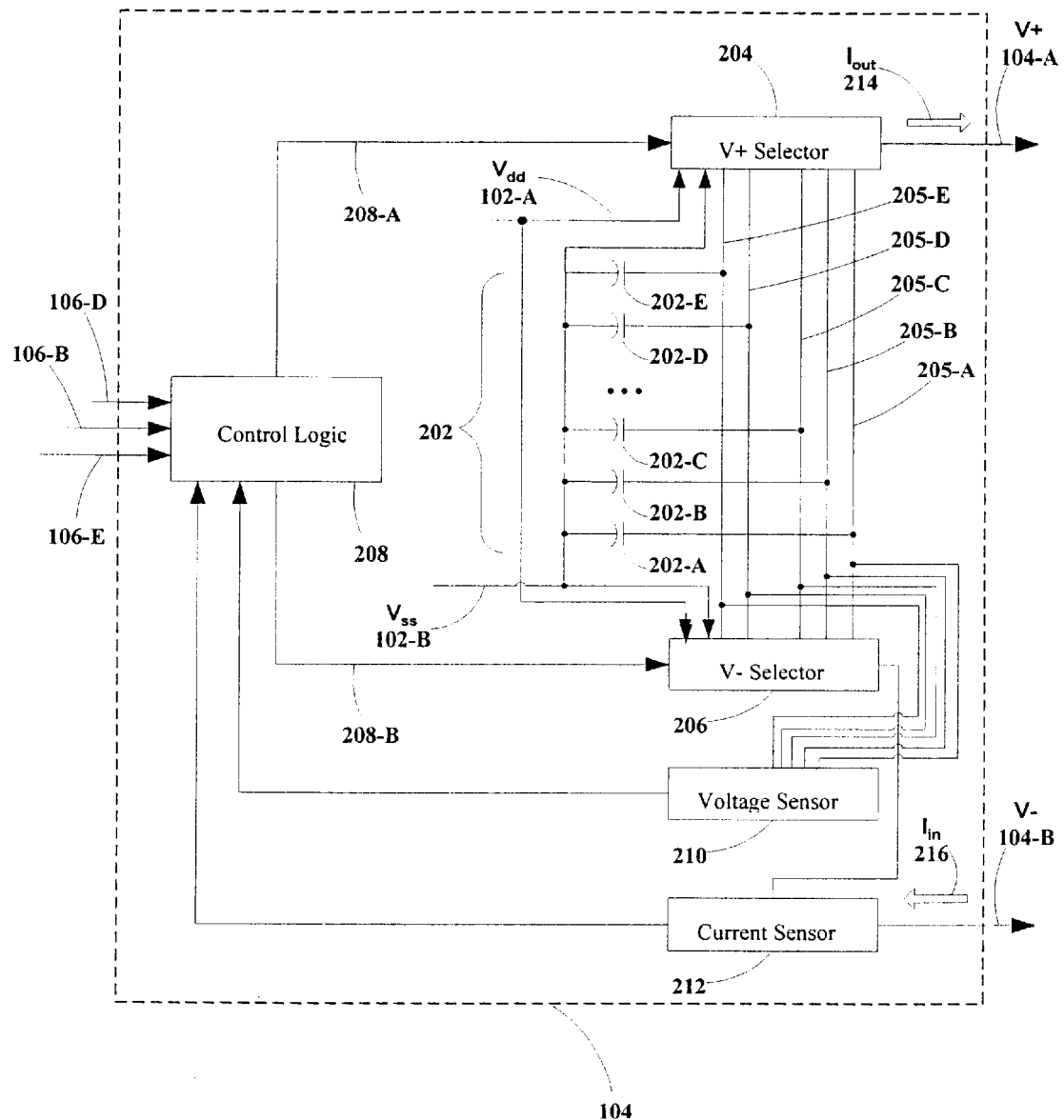
FIG. 2 shows a general block diagram of a switched-capacitor tracking power-supply according to the present invention.

According to the invention, and as illustrated in FIG. 1 and FIG. 2, tracking power-supply 104 is implemented using one or more capacitors 202 along with the primary power source 102. The purpose of capacitors 202 is to store electrical energy and act as voltage supply sources. At each instant, capacitors 202 and the primary power source outputs 102-A and 102-B form a group of possible voltage supply sources, control logic unit 208 examines the state of the whole system, and periodically selects one of the possible supplies ($V_{dd}$ 102-A, $V_{ss}$ 102-B, or one side of any one of capacitors 202-A, 202-B, 202-C, 202-D, or 202-E) as the positive supply V+ 104-A to power stage 108, and one of the possible supplies ($V_{dd}$ 102-A, $V_{ss}$ 102-B or one side of any one of capacitors 202-A, 202-B, 202-C, 202-D, or 202-E) as a negative supply V− 104-B to power stage 108. No resistors or inductors are used. Depending on the selection made by control logic unit 208, some of capacitors 202 may be charged or discharged through output load 112 so that there be no loss of energy within tracking power-supply 104. By applying a selection algorithm, control logic unit 208 can maintain a desired network state.

To illustrate the operation of the switched-capacitor tracking power-supply, assume that at a time $t_0$, all of capacitors 202-A, 202-B, 202-C, 202-D, or 202-E are discharged, and hence there is initially a voltage equal to $V_{ss}$ 102-B on lines 205-A, 205-B, 205-C, 205-D, and 205-E.

Figure 3:
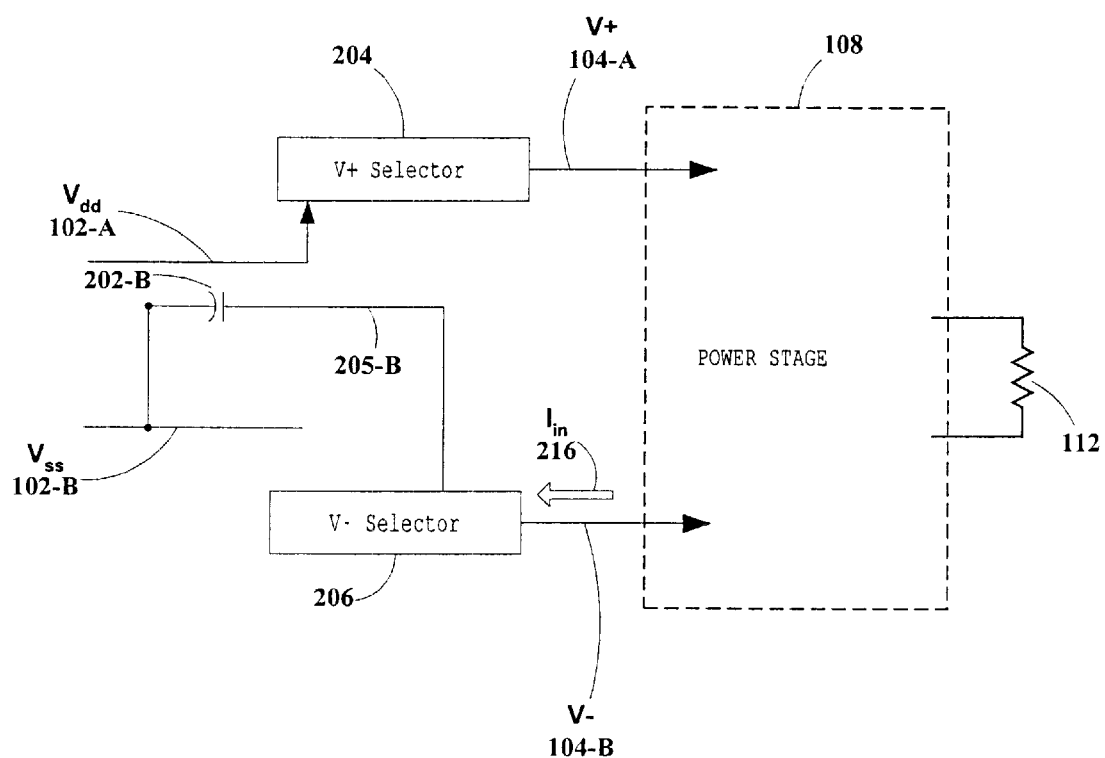
FIG. 3 shows an example of a state of a switch-capacitor tracking power-supply according to the present invention at a time $t_1$.

FIG. 3 shows an example of a state of switched-capacitor tracking power-supply 104 at a time $t_1$ subsequent to time $t_0$. In this example, in response to the needs of power stage 108, control logic unit 208 (FIG. 2) has set V+ selector 204 to select $V_{dd}$ 102-A to provide V+ 104-A, and has set V− selector 206 to select capacitor 202-B on line 205-B to provide V− 104-B. This provides an initial instantaneous voltage of $V_{dd}-V_{ss}$ across output load 112. During the time interval (t, t+Δf) the flow of current $I_{in}$ 214 through V− selector 206 charges capacitor 202-B gradually. Thus the supply voltage seen by the power stage (that is, $V_{ss}-V_{capacitor}$) decreases gradually. Since the energy dissipated in the power stage is proportional to the difference between the supply voltage and the output voltage, the decrease of supply voltage to the power stage actually decreases the energy dissipated in the power stage, and this 'saved' energy is stored in capacitor 202-B.

The flow of current $I_{in}$ 214 through V− selector 206 charges capacitor 202-B, to recover and store usable energy that is not dissipated by power stage 108 and output load 112. In the case of the linear power stage, by setting V+ 104-A and V− 104-B to be minimally outside the voltages required by power stage 108, the energy dissipated by power stage 108 will be minimized, and the majority of the energy loss will be confined to output load 112. The length of time interval Δt that switched-capacitor tracking power-supply 104 remains in this selected state should be small in comparison with the time-constant for charging and discharging the capacitors in order that the voltage across output load 112 remains large enough to satisfy the requirements of power stage 108. Similarly, in the case of a discrete power stage, by setting V+ 104-A, and V− 104-B to be close to the required voltage at the load, the energy of the error can be minimized. Over the duration of time interval Δt, assume that current $I_{in}$ 214 charges capacitor 202-B to a voltage ΔV so that line 205-B is at a voltage $V_{ss}+\Delta V$ at the end of time interval Δt.

Figure 4:
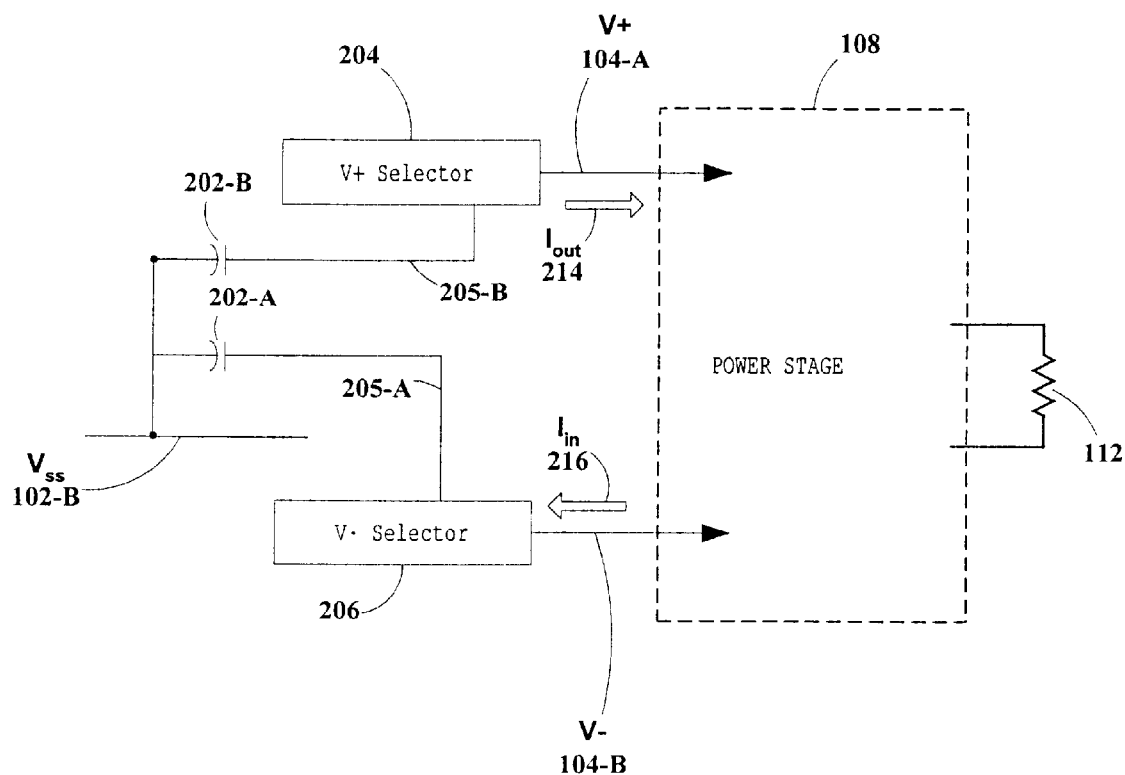
FIG. 4 shows an example of a state of a switched-capacitor tracking power-supply according to the present invention at a time $t_2$ subsequent to time $t_1$.

FIG. 4 shows another example of a state of switched-capacitor tracking power-supply 104 at a time $t_2=t_1+\Delta t$. In this example, in response to the needs of power stage 108, control logic unit 208 (FIG. 2) has set V+ selector 204 to select capacitor 202-B on line 205-B to provide V+ 104-A, and has set V− selector 206 to select capacitor 202-A on line 205-A to provide V− 104-B. Because capacitor 202-A is initially discharged, at time $t_2$ V− 104-B will be at a voltage $V_{ss}$.

As discussed above, at time $t_2$ the voltage on line 205-B is $V_{ss}+\Delta V$. Assume that switched-capacitor tracking power-supply 104 remains in this selected state also for time interval Δt, during which capacitor 202-B discharges through power stage 108 by current $I_{out}$ 214 and capacitor 202-A charges through power stage 108 by current $I_{in}$ 216 (which equals current $I_{out}$ 214). The voltage on capacitor 202-B thus decreases, while the voltage on capacitor 202-A increases. At the time interval (t+Δt, t+2Δ), thee is already a voltage ΔV across capacitors 202-B. If the required output at time t+Δt is less than ΔV, capacitor 202-B is sued as the positive supply, and the less energy will be dissipated in the power state compared with using $V_{dd}$. As before, capacitor 202-A will be charged during this time interval, and the supply voltage 'seen', by the power stage will decrease during the time interval, thereby also decreasing the energy dissipated, and storing this energy into capacitor 202-A.

As the demands of power stage 108 change in response to changing requirements to amplify input signal 110 (FIG. 1), control logic unit 208 (FIG. 2) will set V+ selector 204 and V− selector 206 to select different capacitors as necessary to meet the requirements, utilizing energy stored in the capacitors.

Figure 6:
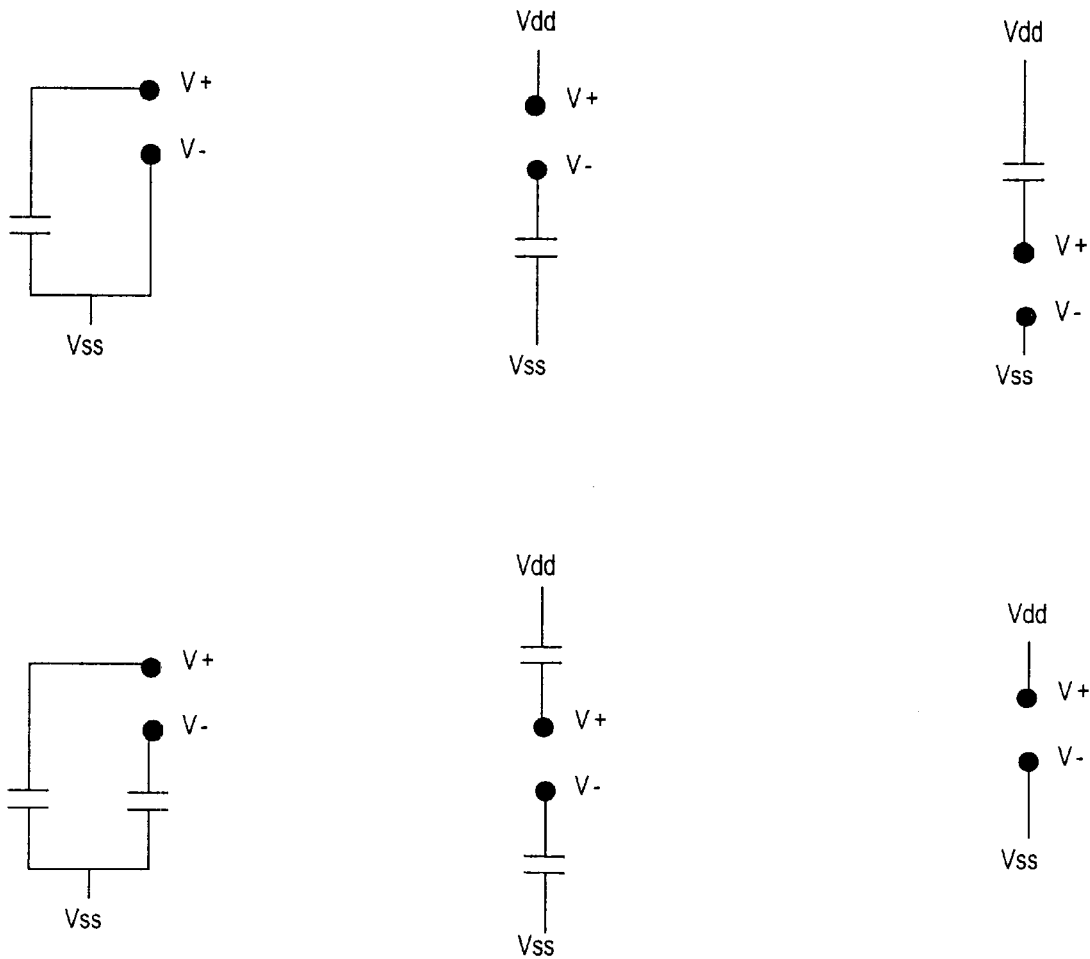
FIG. 6 shows some non-limiting examples of possible circuits that can be achieved by different network connections in the tracking power-supply according to the present invention.
Figure 7:
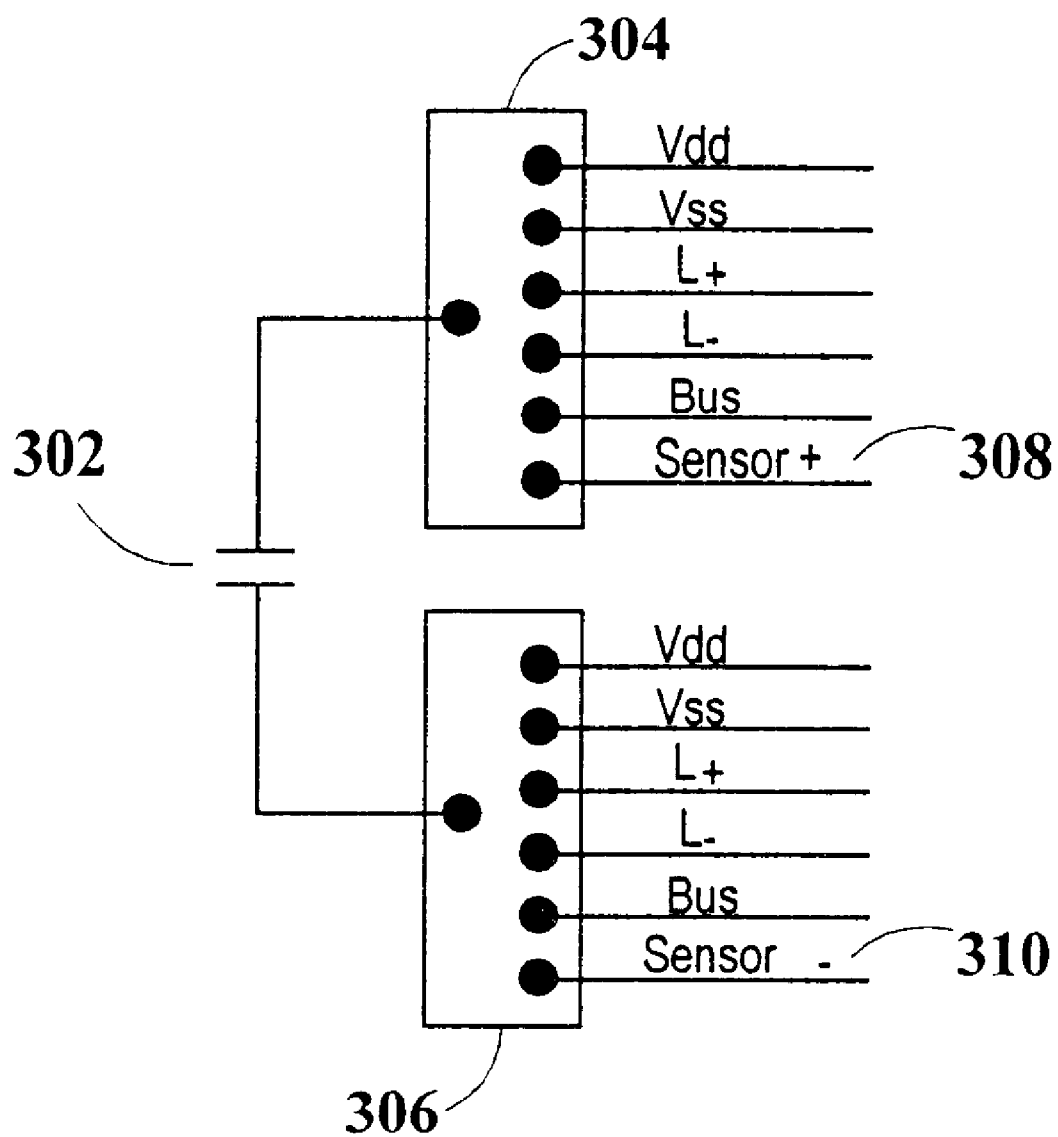
FIG. 7 shows a capacitor with a versatile selector according to the present invention.

FIG. 6 illustrates, by way of example, a variety of circuits which can be achieved by different configurations of the capacitors of a tracking power-supply according to the present invention. The examples of FIG. 6 involve up to two capacitors at a time. FIG. 7 shows a capacitor 302 with an upper selector 304 and a lower selector 306. Using this selector configuration in conjunction with a number of capacitors, many different circuits, such as illustrated in FIG. 6 can be created. Upper selector 340 also has a connection 308 to the 'sensor +' and lower selector 306 has a connection 310 to the 'sensor'. These are for input of the voltage on each capacitor, and serve as information input into control logic unit 208 (FIG. 2).

Stepped-Up Supply Voltages

Figure 5:
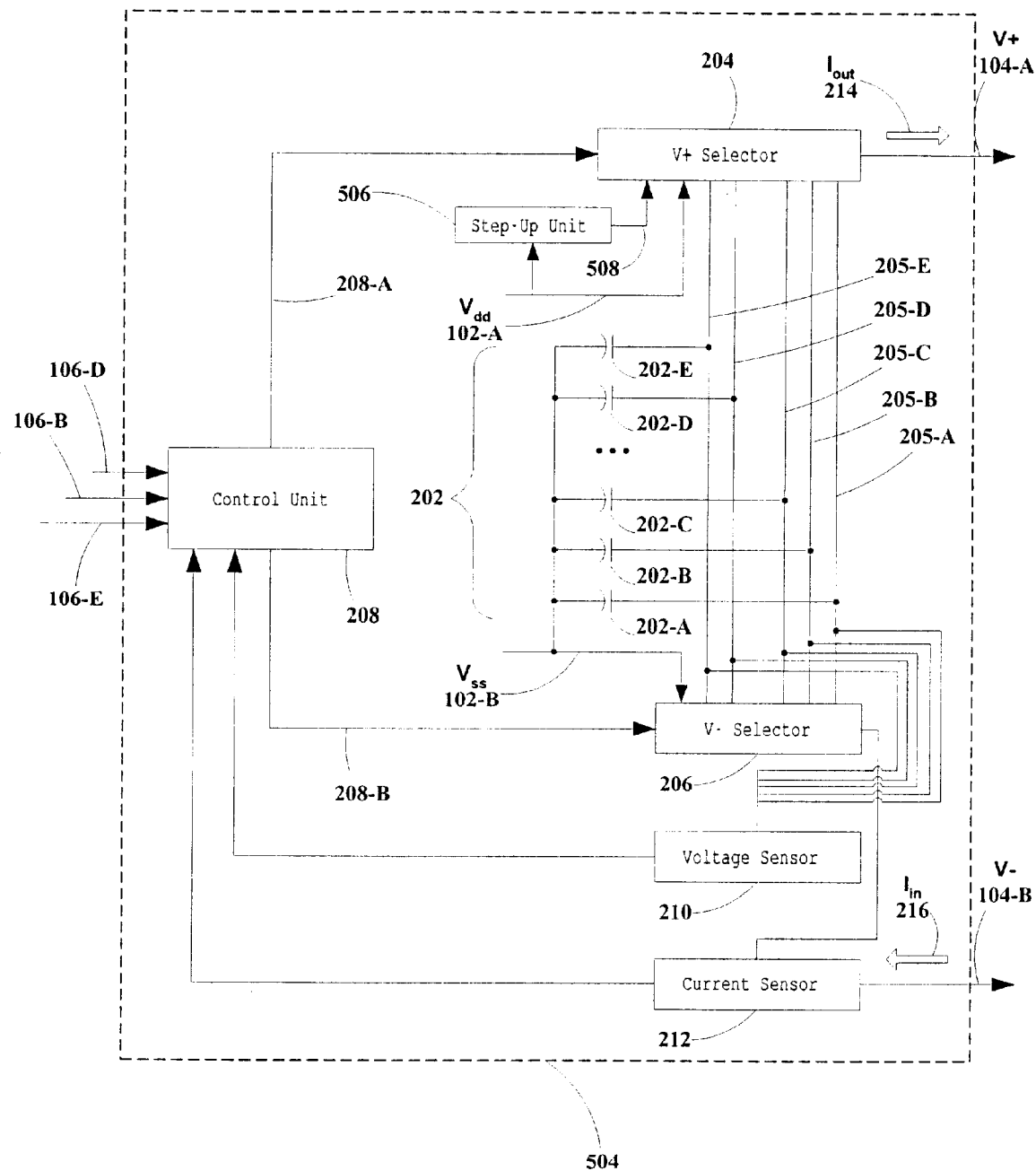
FIG. 5 is a block diagram of a switched-capacitor tracking power-supply according to the present invention incorporating a voltage step-up unit.

According to another embodiment of the invention, the group of possible voltage supply sources can also include voltage supplies with higher voltages than the main power-supply. Such supplies can be achieved by any of the efficient DC-to-DC 'step up' circuits currently known in the art. FIG. 5 shows a switched-capacitor tracking power-supply 504 having a voltage step-up unit 506 fed by $V_{dd}$ supply 102-A and in turn supplying an increased voltage to V+ selector 204 via a line 508. In this manner, an increased voltage can be output as V+ 104-A.

Internal Voltage Step-Up

Figure 8:
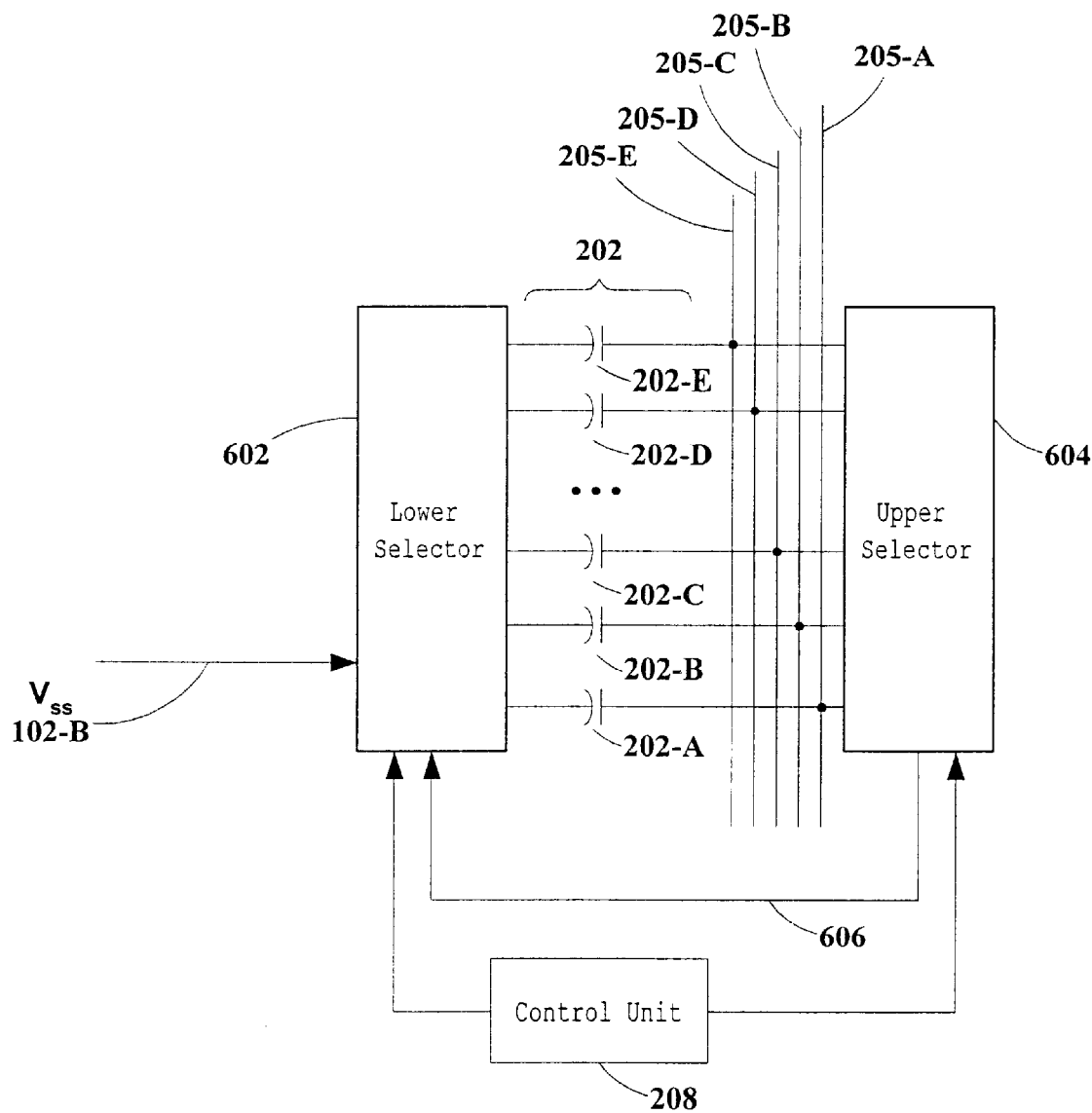
FIG. 8 shows a configuration for the internal step-up of voltage by switching circuits, according to the present invention.
Figure 9:
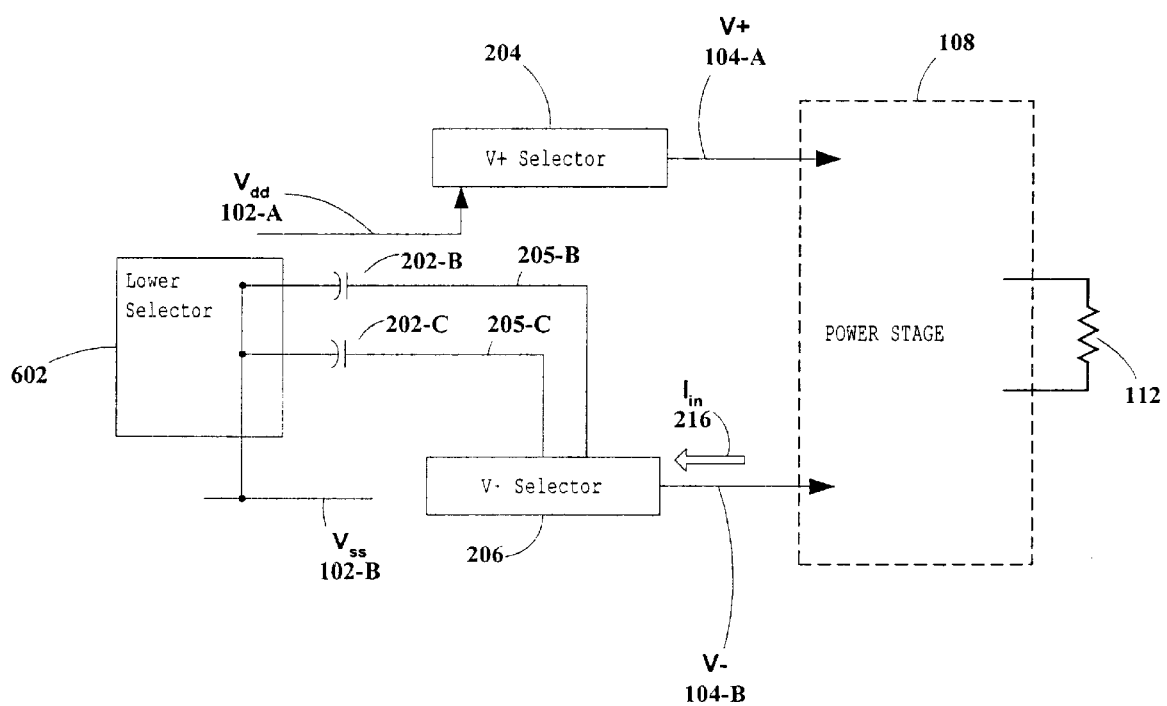
FIG. 9 shows an example of a state of a switched-capacitor tracking power-supply with internal voltage step-up according to the present invention at a time $t_3$.
Figure 10:
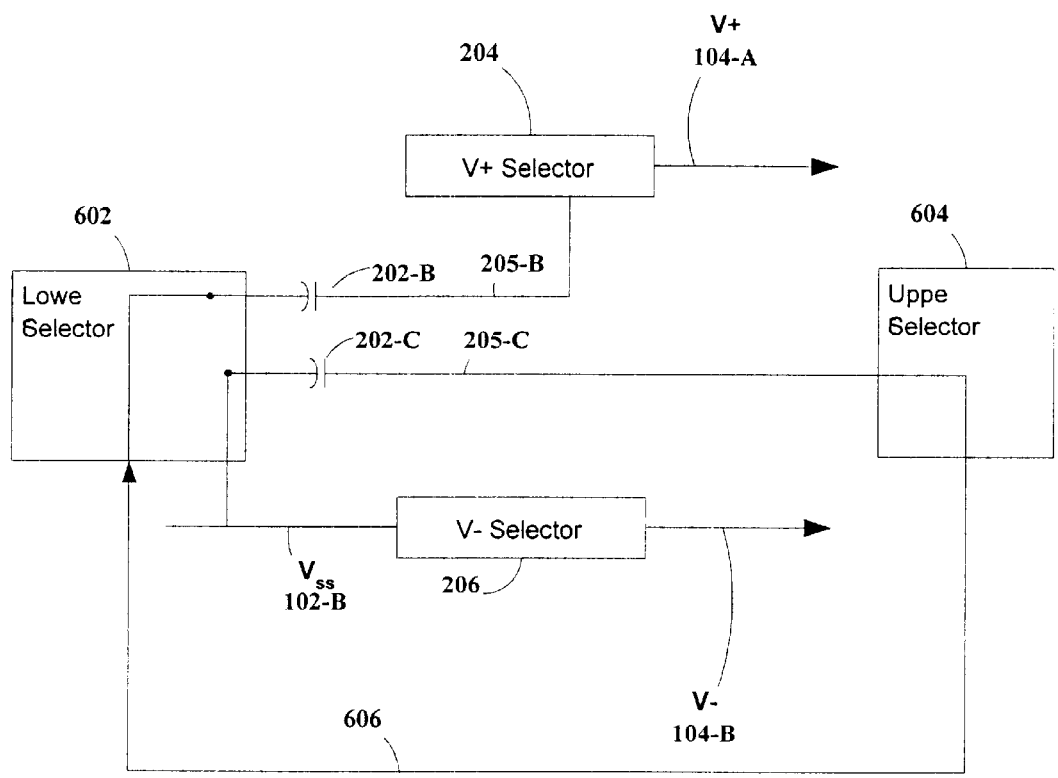
FIG. 10 shows an example of a state of a switched-capacitor tracking power-supply with internal voltage step-up according to the present invention at a time $t_4$ subsequent to time $t_3$.

According to still another embodiment of the invention, it is possible to configure the switched capacitors with additional selection circuitry to create the stepped-up voltages without a separate voltage step-up unit. FIG. 8 illustrates such a configuration, having two additional selectors, a lower selector 602 which selects from the lower terminals of capacitors 202 and an upper selector 604 which selects from the upper terminals of capacitors 202. In this configuration lower selector 602 and upper selector 604 are controlled by control unit 208, and a connection line (bus) 606 is provided to allow the upper terminal of a capacitor to be connected to the lower terminal of another capacitor according to the selections of lower selector 602 and upper selector 604. In this fashion it is possible to cascade capacitors and main supplies in series and thereby add voltage together. FIG. 9 illustrates an example of a state of lower selector 602 at a time $t_3$, in which lower selector 602 connects the lower terminals of capacitor 202-B and capacitor 202-C to $V_{ss}$ 102-B. The upper terminals of capacitor 202-B and capacitor 202-C are connected via V− selector 206 to provide V− 104-B and these capacitors are thus charged in parallel to the same voltage by current $I_{in}$ 216. In this example, upper selector 604 (FIG. 8) does not select any capacitors at time $t_3$ and is not shown in FIG. 9. FIG. 10 illustrates a later state of this power supply at a time $t_4=t_3+\Delta f$, in which the connections of the capacitors are changed by different selections of lower selector 602 and the involvement of upper selector 604. As shown in FIG. 10, capacitor 202-B is no longer connected in parallel with capacitor 202-C, but rather these two capacitors are connected in series via upper selector 604 and line 606, so that the upper terminal of capacitor 202-B on line 205-B to V+ selector 204 has a voltage which is the sum of the voltages of capacitor 202-B and capacitor 202-C. Thus, voltage V+ 104-A is effectively double the voltage to which each capacitor was charged when the parallel charging arrangement was in effect (FIG. 9).

Doubling the Output Range by Inversion

As can be seen from the example of FIG. 2, the selectors can create the same absolute voltage difference between the V+ and V− in both polarities simply by interchanging the selections for V+ and V−. In this way, a peak-to-peak voltage of $2*(V_{dd}-C_{ss})$ can be easily generated between the V+ and V− terminals.

Selection Algorithm

The accuracy of the tracking of the tracking power-supply directly affects the resulting efficiency, and thus the instantaneous goal of the selection algorithm is to minimize the target function. On the other hand, because the capacitors are charged and discharged only while selected, longer term considerations should also be applied to guarantee a good network state and the availability of enough choices during future time intervals. Thus, the selection algorithm for selecting the capacitor switching is critical for the resulting efficiency. Efficient selection algorithms may involve knowing the input signal statistics, predicting the input signal, and complex decision strategies. Some selection algorithms for selection are presented below.

Free-Running Capacitor Selection Algorithm

In an embodiment of the present invention, a selection algorithm simply minimizes the target function. This selection algorithm is herein denoted by the term 'free-running capacitor'. Empirical statistical simulations show that the typical speech as an input signal, the free-running capacitor selection algorithm will yield about 70% efficiency using three capacitors. This is a favorable improvement over the 25% efficiency of a class-AB power amplifier with a similar input signal. In the special case of a single capacitor, this selection algorithm provides to be surprisingly efficient compared with more sophisticated strategies.

Constrained Capacitor Selection Algorithm

In another embodiment of the present invention, a more sophisticated selection algorithm tries to keep the voltages across the capacitors within a predefined range of voltages. This selection algorithm is denoted herein by the term 'constrained capacitor'. To achieve this target, another condition is imposed, whereby a capacitor can be selected such that the voltage across it will increase only when the that voltage is below the allowed range. Likewise, a capacitor can be selected such that the voltage across it will decrease only when that voltage is above the allowed range. The determination of the voltage ranges for each capacitor is critical for the success of this selection algorithm. Because each capacitor eventually strays within a range, it can be shown that, starting from initial conditions where each capacitor is within range, the average current through this capacitor will be zero, and so will be the average current through all capacitors combined. It can be shown that for this condition to be satisfied while still being efficient, it is required that approximately the same output voltage be generated in at least two ways. One way is such that the overall charge on all capacitors will increase, and another way is such that the overall charge on all capacitors will decrease.

Targeted Capacitor Selection Algorithm

In another embodiment of the present invention, a simplification of the constrained capacitor selection algorithm is to try to keep the voltages across the capacitors sufficiently close to a target voltage. This selection algorithm is herein denoted by the term 'targeted capacitor'. To achieve this, a condition is imposed on the selection algorithm, whereby a capacitor can be selected such that the voltage across the capacitor will increase only when that voltage is below the target voltage. Likewise, a capacitor can be selected such that the voltage across the capacitor will decrease only when that voltage is above the target voltage.

A convenient property of the targeted capacitors selection algorithm is that in order to implement it, only a 1-bit state per capacitor is needed to be known, indicating whether the voltage on each capacitor is above or below the target voltage. Such a 1-bit state can be generated by comparators that compare the voltage over each capacitor to the respective target voltage.

Estimation of the Average Output Voltage from each Capacitor for the Targeted Capacitors Selection Algorithm The term 'target error', herein denotes the error of the actual average voltage supplied by a capacitor during a load time interval relative to the capacitor's target voltage. A convenient property of the targeted capacitors selection algorithm (detailed above) is that the deviation of each capacitor's voltage from the respective target voltage can be guaranteed not to exceed a predetermined maximum deviation. This is because, over any time interval during which a capacitor discharges, the initial voltage on that capacitor is equal or higher than the respective target voltage, and depending on the network parameters, there is a limit on how much the capacitor can discharge by the end of the time interval. The same applies to any time interval during which a capacitor charges. Thus the voltage over each capacitor will vary around the respective target voltage, and the capacitance, the load impedance, and the switching time intervals can be chosen such that the deviation of the capacitor voltage from the target voltage is guaranteed not to exceed a predetermined maximum deviation. If the voltage over a capacitor is above target, for example by the above-mentioned maximum deviation, then during the next load time interval where this capacitor is used, the capacitor will discharge. Thus, the average voltage supplied by the capacitor over the whole time interval is closer to the target voltage than the above-mentioned maximum deviation. Therefore, the target error is smaller than the maximum deviation, and can be very close to zero if the voltage across the capacitor crosses the value of the target voltage during the load time interval.

Hence, by using the targeted capacitors selection algorithm, the network of switched capacitors can be designed such that a capacitor's target voltage serves as a good estimate of the capacitor's average output voltage. This property is useful in providing a good estimated network state with a simple 1-bit state sensor.

2*N+3 Level Quantizer using N Capacitors and the Targeted Capacitors Selection Algorithm It can be proven that, using the targeted capacitors selection algorithm where the target voltages for each capacitor are evenly distributed between $V_{dd}$ and $V_{ss}$; and where the network of switched capacitors is capable of creating at least the group of voltages 0, $\pm(V_{dd}-V_{ss})$, $\pm(V_{dd}-V_{ss}-C_n)$, $\pm(V_{dd}-V_{ss}+C_n-C_m)$, $\pm(C_n)$, $\pm(C_n-C_m)$ between the tracking power supply output terminals; then at any given moment it is possible to create any output voltage from the group $\pm J/(N+1)*(V_{dd}-V_{ss})$ up to the target error, where $0 \leq J \leq N+1$, and where N equals the number of capacitors. This provides a behavior similar to that of a quantizer with 2*N+3 quantization levels.

$1+2^{(N+1)}$ Level Quantizer using N Capacitors and the Targeted Capacitors Selection Algorithm Using the targeted capacitor selection algorithm where the target voltages for the capacitors are distributed as a series of negative powers of 2 starting from $(V_{dd}-V_{ss})*2^{-1}$ for the first capacitor $C_1$, $(V_{dd}-V_{ss})*2^{-2}$ for the second capacitor $C_2$, and so on up to $(V_{dd}-V_{ss})*2^{-N}$ for the Nth capacitor $C_N$, and where the network of switched capacitors is capable of creating between the tracking power supply output terminals at least any of the following combination of the supplies and capacitors:

$$\pm(A_0*(V_{dd}-V_{ss})+A_1*C_1+A_2*C_2+\ldots+A_N*C_N)$$

Where $A_1, \ldots A_N$ are any of $-1$ or 0 or 1

And where $A_0$ is either 0 or 1

Than it can be proven that with the above network, and given the restrictions of the targeted capacitor selection algorithm, in all cases any level between $-(V_{dd}-V_{ss})$ and $(V_{dd}-V_{ss})$, in increments of $(V_{dd}-V_{ss})*2^{-N}$ can be created up to the target errors. This is easily proven by observing that any voltage $(V_{dd}-V_{ss})*2^{-n}$ can be generated either by using directly the capacitor $C_n$ (in which case the capacitor $C_n$ will discharge), or by using $C_{(n-1)}-C_n$ where n>1, or $(V_{dd}-V_{ss}-C_1)$ where n=1 (in which case the capacitor $C_n$ will charge). This provides a behavior similar to that of a quantizer N+1 bits. By adding the voltages $(V_{dd}-V_{ss})*2^{-n}$, any level close to $\pm K*(V_{dd}-V_{ss})*2^{-N}$ can be generated, with an error related to the target error.

Proof:

To simplify, relate to the case where $(V_{dd}-V_{ss})=1$, and to the target error as 0. Denote the 1-bit state for the nth capacitor by $S_n$, where $S_n=1$ means that the voltage across the capacitor is above the target voltage, and where $S_n=0$ means that the voltage is below the target voltage. $S_0$ stands for the logical 1-bit state of the positive supply $V_{dd}$, and is by definition always 1 (this manifests the fact that the supply always supplies current to charge the capacitors). First, relating only to positive quantization levels, find the binary representation: $K*2^N = B = (B_0*2^0 + B_1*2^{-N})$, where: $0 \leq K \leq 2^N$, and $B_0 \ldots B_N$ are 0 or 1. If the 1-bit state of all capacitors allows them to discharge, then generating any such value can be done simply by cascading the capacitors whose corresponding bit $B_n$ is 1. For the generic case where the 1-bit states are arbitrary, the following algorithm will find how to generate the desired output while conforming to the targeted capacitors selection algorithm:

For each bit $B_n$, starting from the least significant bit $B_N$ to $B_0$ compute $A_n$ recursively as follows:

(1) If ($B_n=0$) then $A_n=0$;

(2) If ($B_n=1$ and $S_n=1$) then $A_n=1$;

(3) If ($B_n=1$ and $S_n=0$) then $A_n=-1$; $B=B+2^{-n+1}$.

At the end of this procedure we will get $A_0$ to $A_N$ as defined above

Where $A_1 \ldots A_N$ are any of $-1$, 0, or 1; and where $A_0$ is either 0 or 1.

The control logic should create a network connection cascading the cascading the capacitors according to their respective coefficients $A_n$. When $A_n=0$ the corresponding capacitor is not used, when $A_n=1$ the corresponding capacitor is cascaded with positive polarity, and when $A_n=-1$ the corresponding capacitor is cascaded with negative polarity. Finally, the sign of the desired output can be applied by connecting the network's output terminals according to the desired polarity. This completes the proof.

Furthermore, it can be shown that the above proof can be generalized such that the same results can be achieved with the target for the capacitor $C_n$ being of the more general form $M*(V_{dd}-V_{ss})*2^{-n}$ where M is any odd integer.

Target Function

As noted previously, a target function should be provided for determining the output of the tracking power-supply in order that the tracking power-supply be able to accurately track the output requirements. In an embodiment of the present invention that uses a linear power stage, the target function $V_p$ is a function of the input signal and the internal input to the power stage, and is given by $V_p$ (input signal, internal input)=maximum$((1+e) \times |(K \times \text{internal input})|, |(K \times \text{internal input})|+a, b)$, where $\|$ denotes taking the absolute value, and:

e is a constant $0<e<<1$, that allows a margin for overcoming system gain inaccuracies due to components' inaccuracies and parasitic losses.

a is a constant $0<a$, that allows a margin for the minimal voltage difference required by the linear power stage between the output voltage and the supply voltage.

b is a constant $0<b<<1$, that allows a margin for overcoming the system's DC offsets.

K is the gain of the power stage.

Noise-Shaping

In an embodiment of the present invention, control logic unit 208 implements noise-shaping such that the output of the power amplifier is given by:

output=$K \times$input signal$\times FS+E \times FN$, where

K is the desired system gain;

FS is a transfer function that is substantially unity in the range 20 Hz–20 Khz;

E is any error introduced to the system between the control logic unit and the final output; and FN is a transfer function essentially following the auditory hearing threshold.

In another embodiment of the present invention, the transfer function FS is given by the expression:

$$FS = \frac{1}{1+\frac{s}{K_1}+\frac{s^2}{K_1 K_2}},$$

and FN is given by the expression:

FN=$s^2$FS, where $0<K_1$ and $0<K_2$.

The purpose of such transfer functions is to minimize the audibility of the noise in the output. Therefore, suitable transfer functions should be selected according to human auditory response, using a human auditory sensitivity filter. Other possible implementations of noise shaping both for the digital and analog domain can be found in reference [3].

Predictive Control

A selection algorithm can consider predicted values when determining a network connection. This is especially applicable to power amplification of recorded audio, or where a delay line can be inserted before the power stage and so future values of the input signal can be exactly determined. Even for non-recorded audio, it is often possible to apply a predictive algorithm for the input signal. If a prediction can be obtained for the input signal, it is then possible to obtain a prediction of the internal input to the power stage.

Analog/Digital Implementation of the Noise-Shaping Loop and Control Logic

There are several options for implementing the noise-shaping loop and control logic. The different implementations involving the digital domain, analog domain, and analog-digital mixed-signal hybrids, are covered in detail below.

Fully-Analog Implementation of the Noise-Shaping Loop and Control Logic

Figure 11:
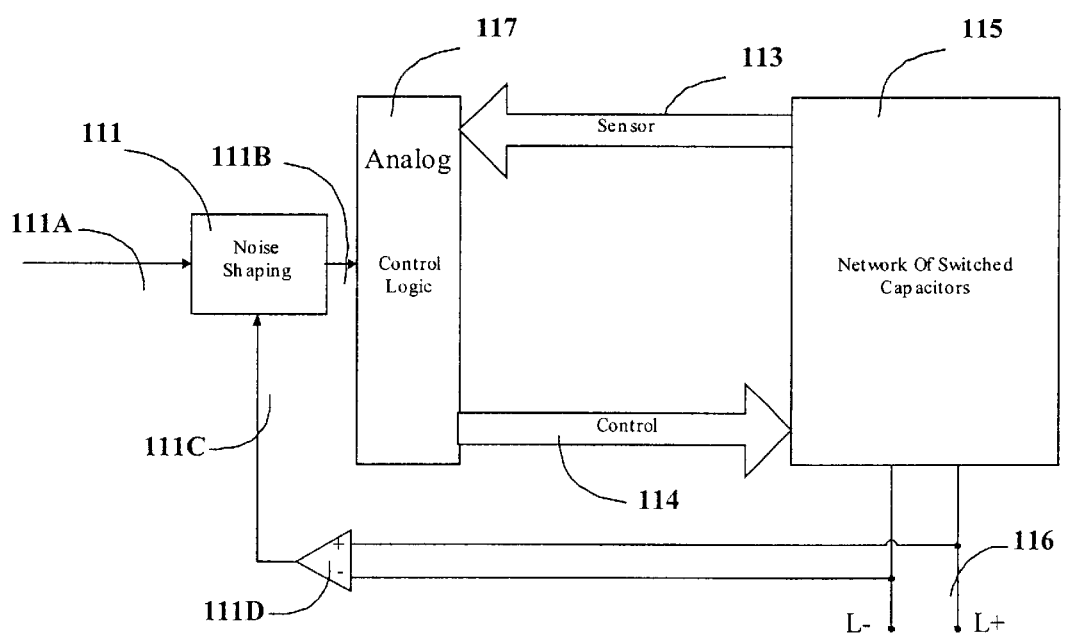
FIG. 11 shows a block diagram of a discrete power stage power amplifier with analog noise-shaping loop and control logic according to the invention.

FIG. 11 illustrates a fully-analog implementation of the noise-shaping loop and control logic according to an embodiment of the present invention. Analog implementations of the noise-shaping loop are known in the art. For example, similar techniques to those used in sigma-delta modulators are appropriate to use in embodiments of the present invention. These techniques use a negative feedback and integrators. Higher order sigma-delta networks can be implemented as well, depending on the kind of noise-shaping loop needed.

In such an implementation, the inputs to a noise shaping unit 111 are an analog input 111A and an analog feedback 111C taken through a differential buffer 111D from power stage output terminals 116.

To implement a control logic unit 117 in the analog domain, the value of the target function for different network connections must be computed, and the network connection corresponding to the minimum value should be chosen. Control logic unit 117 receives a sensor input 113 from a network of switched capacitors 115, and sends a control signal 114 thereto. Different network connections can be created with the sensor instead of the load terminals. Those skilled in the art can readily see that computing the value of the target function can be done using analog adders. The minimum value can be stored in an analog sample-and-hold component, and can be compared against new 'candidate' values using analog comparators.

Figure 11A:
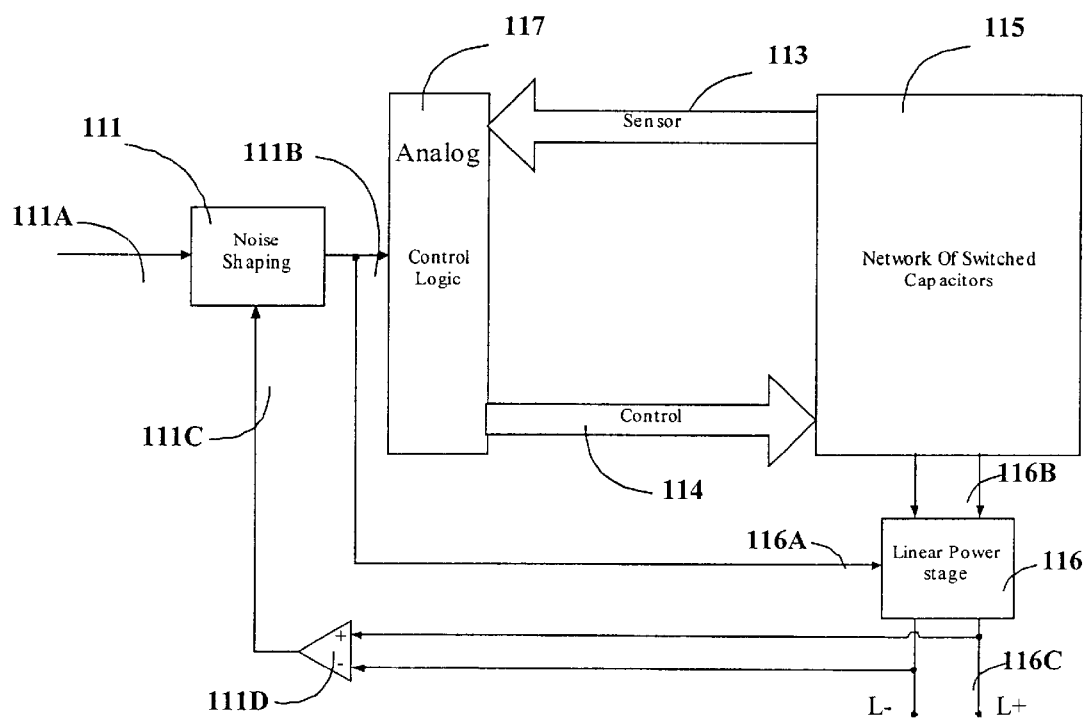
FIG. 11A shows a block diagram of a linear power stage power amplifier with analog noise-shaping loop and control logic according to the invention.

FIG. 11A shows another embodiment according to the invention which is the equivalent of the embodiment of FIG. 11, for the case of a linear power stage. Here the outputs 116B of network of switched capacitors 115 are used as the power supply for a linear power stage 116, and the load is connected to an output 116C of linear power stage 116. An input 116A to power stage 116 is taken from an output 11B of noise shaper 111.

Analog Noise-Shaping Loop and Digital Control Logic

Figure 12:
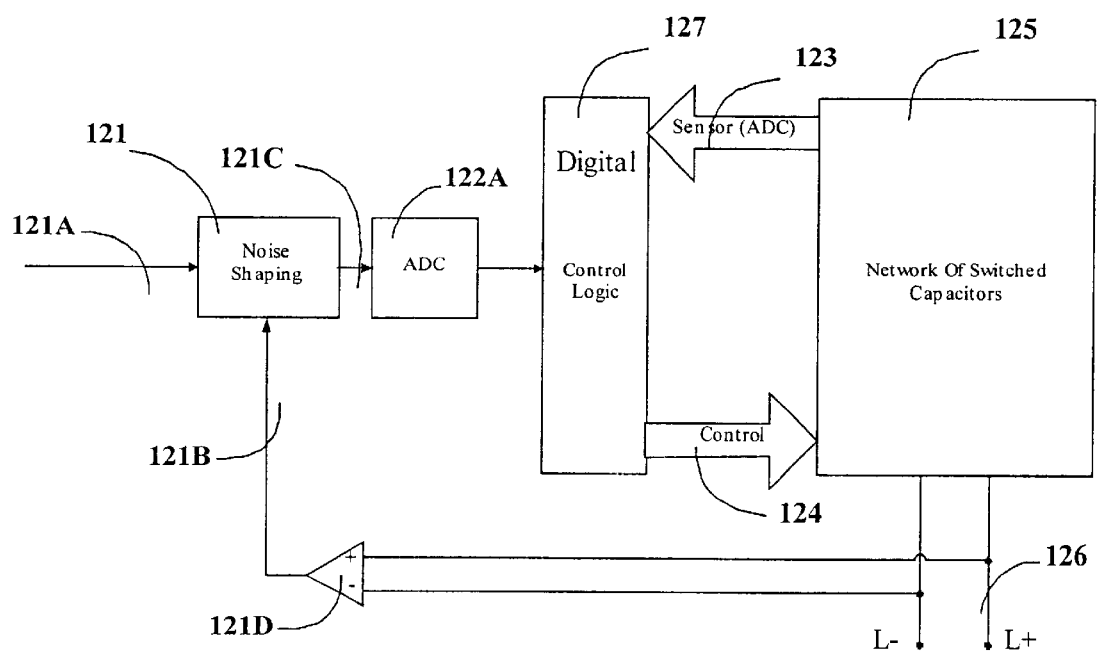
FIG. 12 shows a block diagram of a discrete power stage power amplifier with analog noise-shaping loop and digital control logic according to the invention.

FIG. 12 illustrates an embodiment according to the invention, with an analog noise shaper 121 having an input 121A and a digital domain control logic unit 127. An output 121B of a noise shaper 121 is transferred to control logic 127 through an A-to-D converter 122A via a line 121C. A network of switched capacitors 125 receives control from control logic 127 via a control line 124. The resolution of A-to-D converter 122A needs to be of the same order as that of network of switched capacitors 125. For example, a 4-bit flash A-to-D will suffice for many practical cases. Also sensor 123 is connected to control logic 127 through an A-to-D converter that may be a low resolution flash A-to-D or may be a 1-bit state, as in the case of the targeted capacitors selection algorithm.

The equivalent of this embodiment for the case of a linear power stage can be easily derived in a way similar to FIG. 11 and FIG. 11A.

Fully-Digital Implementation of the Noise-Shaping Loop and Control Logic

Figure 13:
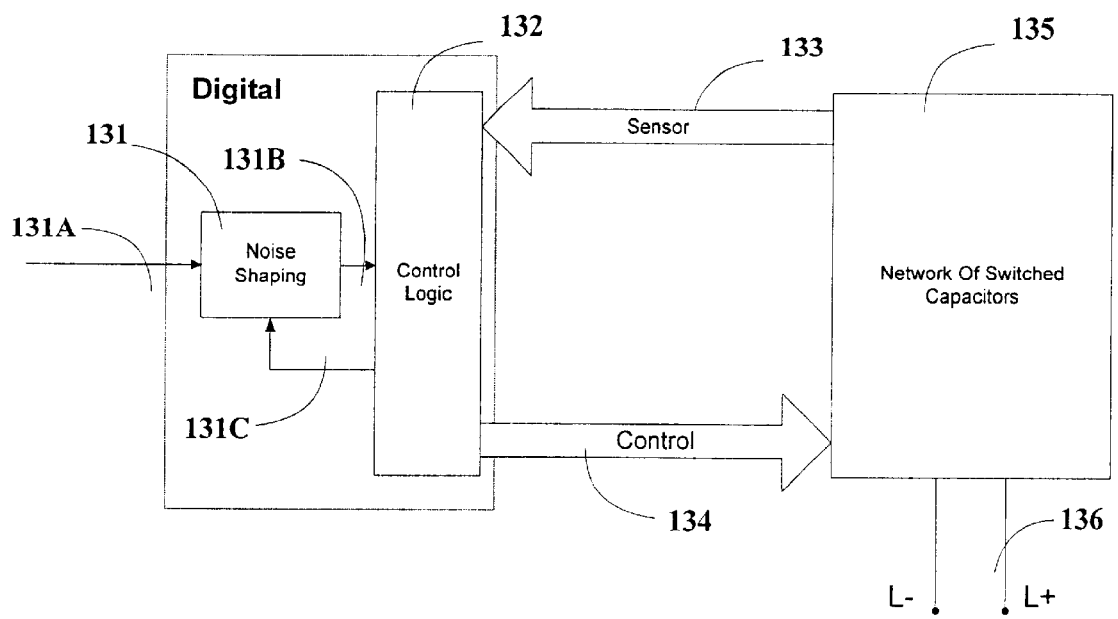
FIG. 13 shows block diagram of a discrete power stage power amplifier with digital noise-shaping loop and control logic according to the invention, where the noise-shaping is performed according to an estimation of the output provided by the control logic.

FIG. 13 illustrates an embodiment according to the invention with a digital noise-shaping loop and control logic, containing a noise-shaping unit 131 having a signal input 131A, an output 131B, and a feedback input 131C; and a control logic unit 132 with a sensor input 133 from a network of switched capacitors 135 and a control 134 to network 135. Network 135 has an output 136. If the network state is known in the digital domain through sensor 133, it is possible to implement the noise-shaping loop and control logic completely in the digital domain. The network state can be monitored via sensor 133 such as an A-to-D converter or the 1-bit state sensors described for the case of targeted capacitors selection algorithm. After performing the selection algorithm, control logic 132 outputs the result in terms of controls to network 135, while at the same time control logic 132 can feed the estimated output in the digital domain back to the noise-shaping loop. The input to the control logic comes from the noise-shaping loop in the digital domain.

Figure 13A:
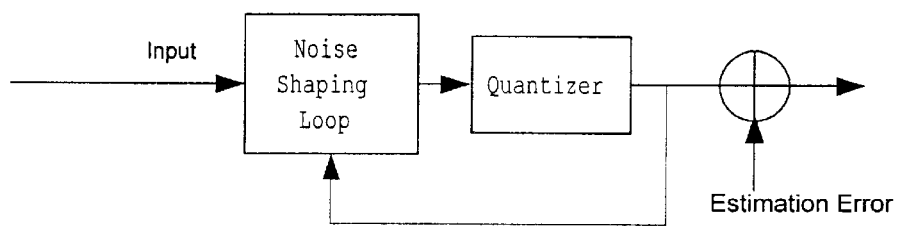
FIG. 13A an interpretation of the block diagram of FIG. 13 as a noise-shaped quantizer with additive noise at the output.

In this embodiment the noise shaping is done via an estimation of the final output, and not via a feedback of the actual final output (output 136), and thus the system is working in an open loop with regard to (final) output 136. It can be shown that the error in estimating the final output is manifest as additive noise at (final) output 136. As explained previously, for example, with regard to the targeted capacitor selection algorithm, this error can be kept small enough. FIG. 13A shows an equivalent representation of the system of FIG. 13, where the noise shaping is done with respect to feedback from the control logic rather than the actual output and the estimation error is manifest as additive error at the output.

Figure 14:
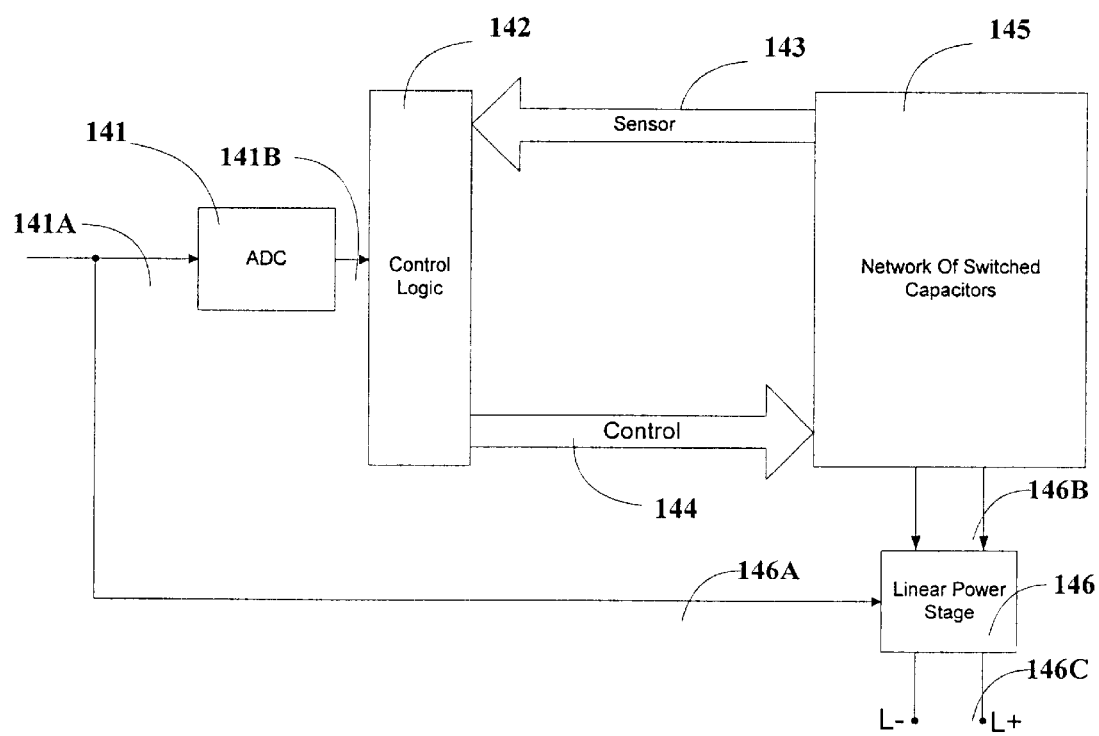
FIG. 14 shows a block diagram of a linear power stage power amplifier with a tracking power supply and no noise-shaping loop according to the invention.

FIG. 14 shows an embodiment of the present invention with a linear power stage 146 and no noise shaping loop. In this embodiment the supplies for linear power stage 146 are provided by an output 146B from a network of switched capacitors 145. An input signal 141A feeds an A-to-D converter 141 having an output 141B into a control logic unit 142 which controls network 145 through a control line 144. Control logic unit 142 receives state information from network 145 through a sensor 143. Linear power stage 146 also receives input signal 141A through a line 146A. The final load is connected to an output 146C of linear power stage 146 via terminals 146C. The switching noise and transients from network 145 to power stage 146 are reduced due to the inherent power-supply-reduction-ratio (PSRR) of linear power stage 146. In this embodiment, the network of switched capacitors is simply used as a quantized tracking power supply.

Network State Estimation

In several embodiments according to the present invention, the network state is estimated by measuring voltages across capacitors through the sensor. This measurement can be done, for example, using a simple 1-bit state as described for the case of targeted capacitors, or using an A-to-D converter. In other embodiments, a goal is to minimize the amount of information sampled through the A-to-D converter. Since not all capacitors change voltage during every time interval, it is sufficient to monitor and update the state of each capacitor only when there is an actual change. Furthermore, it is also possible to monitor the state of each capacitor only once every few changes. Between monitoring operations, the state of the capacitor can be estimated. During such times that the capacitor's state is estimated, the control logic operates according to the estimated network state. Estimates may be based on knowledge of network parameters such as the primary power supplies, the capacitance of each capacitor, the impedance of the output load, and the length of time during which the capacitor was used.

Network parameters may either be supplied to the control logic by the user, or may be measured and estimated by the control logic. To do this, the control logic can create a desired network connection with known initial conditions, and monitor the final conditions after some time interval. This can be done during a dedicated initialization time and/or during operation.

Embodiments of the Network of Switched Capacitors

Several different embodiments of the network of switched capacitors are described below. These embodiments are described by way of non limiting examples, and differ in one or more of the following characteristics:

Complexity of the network of switches and capacitors;
Number of switches;
Number of possible output levels;
Whether the voltage at the output terminals is floating or referenced (to $V_{ss}$ or $V_{dd}$); and
The implementation of the sensor.

Any of these embodiments can serve as the network of switched capacitors according to this invention. Specifically, they can be used in conjunction with the embodiments described above and illustrated in FIGS. 11 to 14.

Figure 15:
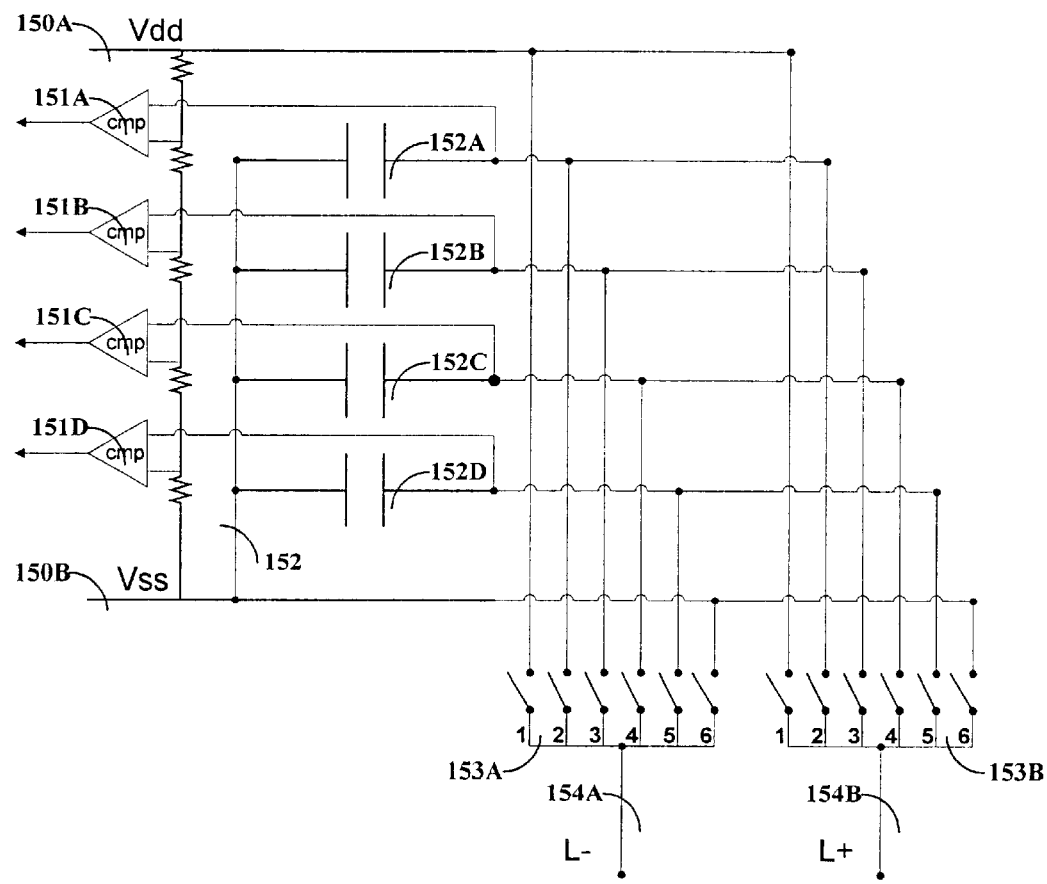
FIG. 15 shows a block diagram of an implementation of an embodiment of the network of switched capacitors according to the invention, suitable for the targeted capacitors selection algorithm.

FIG. 15 shows an embodiment of the network of switched capacitors according to the present invention. The network includes capacitors 152A, 152B, 152C, and 152D, all of which share a common connection 152 which is at voltage $V_{ss}$ 150B. The other sides of the capacitors are connected to comparators 151A, 151B, 151C, and 151D, respectively, and the other inputs to the comparators are at various points in a resistor voltage divider network as shown, which is connected from $V_{ss}$ 150B to a voltage $V_{dd}$ 150A. A load output L+ 154A and a load output L− 154B are selected by a switch 153A and a switch 153B, respectively.

The embodiment illustrated in FIG. 15 uses several techniques to simplify implementation of a power amplifier according to the present invention. These techniques include:

Applying the targeted capacitor selection algorithm.
Using the 1-bit state from comparators 151A–D by the control logic as an input to the selection algorithm.
Using the 1-bit state from comparators 151A–D to estimate the voltage over each capacitor, for use by the control logic and possibly also by the noise shaping loop.

Implementing the targeted capacitors selection algorithm is simple, because only a 1- bit state value is needed to represent whether the capacitor's voltage is above or below the target voltage. This 1-bit state can be derived easily in the analog domain for example by using the comparators, where the target voltage is created by using the resistor network, or any other suitable arrangement. This 1-bit state can be directly available for use in the digital domain.

As explained above, a corollary of the targeted capacitor selection algorithm is that the target voltage for a capacitor is a good estimate of the average output voltage from the capacitor.

Given the estimated voltages on each capacitor, the control logic can select the best possible configuration of switches, subject to the restrictions of the selection algorithm. Once the selection is made, the control logic can also compute the estimated output voltage across the output terminals, using the same estimated voltages on each capacitor. This estimated output voltage can then be used in the digital domain by the noise-shaping loop. The error resulting from performing noise shaping according to an estimated output voltage rather than the exact output voltage can be shown to be an additive error whose magnitude is related to the target error.

As previously noted, in the embodiment illustrated in FIG. 15 one side of four capacitors 152A–D is permanently connected through 152 to Vss 150B. The other terminal of each capacitor is connected to one terminal of one of the comparators 151A–D respectively, and to two switches, one switch from the group 153A-1 through 153A-6 and one switch from the group 153B-1 through 153B-6 that are connected to the output terminals 154A and 154B respectively. The other terminal of each of the comparators 151A–D is connected to a reference target voltage generated by a network of resistors between $V_{dd}$ 150A and $V_{ss}$ 150B. The comparators compare the voltage over each capacitor to the respective target voltage, and thus the output from each comparator 151A–D is a 1-bit state. This 1-bit states forms the sensor which is the input to the control logic, such as sensor 143 to control logic unit 142 (FIG. 14). Each of the load terminals 154A and 154B is connected through a group of 6 switches 153A-1 to 153A-6 and 153B-1 to 153B-6 respectively, to the group of 6 sources including $V_{dd}$ 150A, $V_{ss}$ 150B and the side of each capacitor 152A–152D that is not connected in common. By controlling the 12 switches, different circuits can be created between the output terminals. It is to be noted that the connections of the output terminals 154A and 154B are identical, and thus any circuit can be created between the output terminals in both polarities. The different voltages that can be generated by the network of FIG. 15 between the output terminals are thus: 0, $\pm(V_{dd}-V_{ss})$, $\pm C_n$, $\pm(V_{dd}-V_{ss}-C_n)$, $\pm(C_n-C_m)$. For example, connecting the switches 153A-6 and 153B-6 can generate a voltage difference of 0 at the output terminals 154A and 154B. A voltage difference of (C4–C2) can be generated by connecting the switches 153A-4 and 153B-2. A voltage difference of $(V_{dd}-V_{ss}-C_1)$, can be generated by connecting the switches 153A-5 and 153B-1.

One advantage of the network of FIG. 15 is simplicity. The capacitors are always referenced to Vss, and thus it is straightforward to use comparators and compare their voltages to their respective target voltages. Also, the number of switches is relatively small, 2*(2+N) where N is the number of capacitors used.

A disadvantage of the network of FIG. 15 is that only a relatively small number of possible circuits can be generated, and each circuit can involve at most only 2 capacitors.

Recalling the case of the 2*N+3 level quantizer as described above, it is to be noted that the network illustrated in FIG. 15 cannot generate $\pm(V_{dd}-V_{ss}-C_n+C_m)$. As a result, the error generated by this network relative to the target function is not bounded by $\pm 0.5* (V_{dd}-V_{ss})/(N+1)$, and from time to time a bigger error is generated.

It is also to be noted that the voltage difference between the output terminals is floating, and is not always referenced to $V_{ss}$ or $V_{dd}$. When working with a linear power stage, this can cause transients when the reference at the load terminals changes, and this factor adds noise that must be handled by the noise shaping loop.

Figure 16:
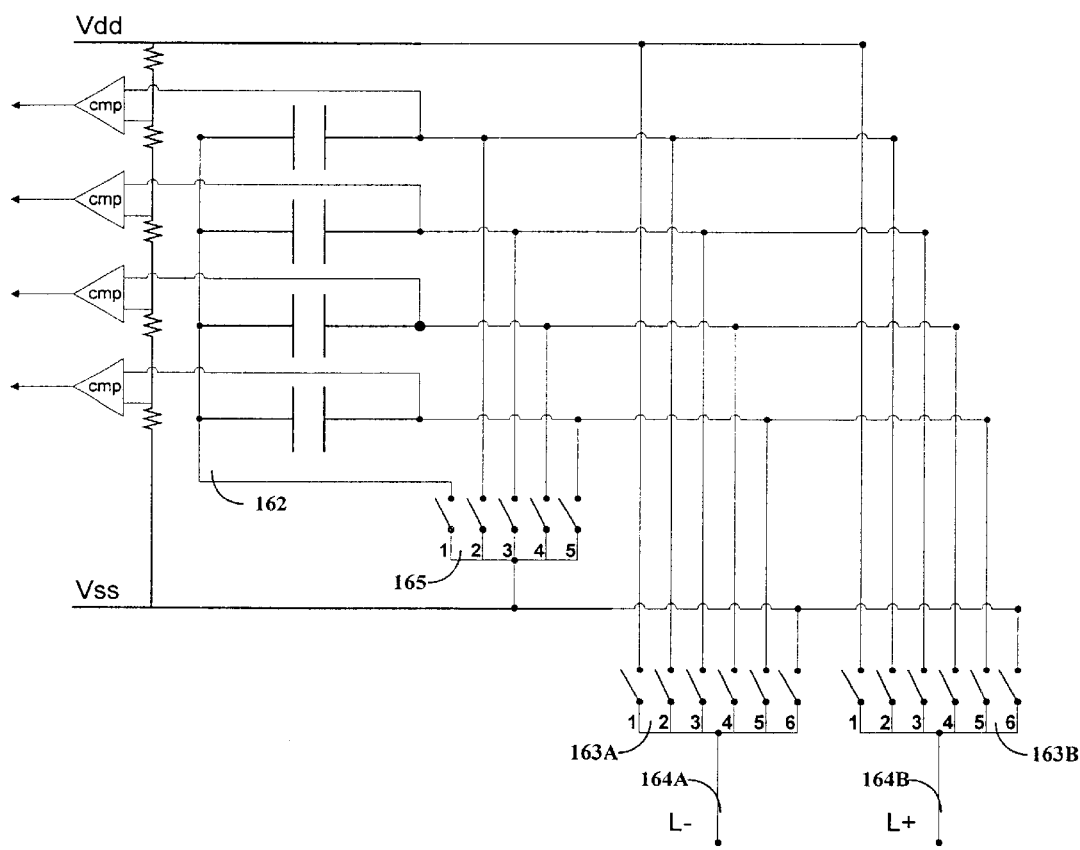
FIG. 16 shows a block diagram of a more versatile implementation of an embodiment of the network of switched capacitors according to the invention, suitable for the targeted capacitors selection algorithm, and capable of generating 2*N+3 quantization levels.

FIG. 16 shows a similar embodiment of the network of switched capacitors, where one side of capacitors 162A, 162-B, 162C, and 162D is connected together at a point 162, but point 162 is not connected permanently to Vss 160B. A group of switches 165-1 through 165-5 is added, that can connect to Vss 160B, any one of: the common side of the capacitors 162A, 162-B, 162C, and 162D, or the non-common side of a capacitor. This network is capable of also generating $\pm(V_{dd}-V_{ss}-C_n+C_m)$. For example $(V_{dd}-V_{ss}-C_1+C_2)$ can be generated by connecting switches 165-3, 163A-2 and 163B-1. Thus, this network is capable of implementing the 2*N+3 level quantizer described above. With this network, the error generated relative to the target function is bounded by $\pm 0.5* (V_{dd}-V_{ss})/(N+1)$.

Generating the 1-Bit State with Floating Capacitors

In order to achieve the greater connection flexibility of the network illustrated in FIG. 16, the capacitors are not permanently connected to $V_{ss}$, and are thus floating. Comparing a floating voltage is more complex than comparing a referenced voltage and there are several alternatives to perform this task. One alternative is to use an additional buffer which is a true floating differential buffer, around each capacitor to extract the voltage thereon and feed that voltage to the comparator, in a way similar to that shown in FIG. 18. Such buffers are more complex and expensive to make, especially in an ASIC environment.

An alternative method, suitable for the network of FIG. 16 as illustrated, is for the control logic to utilize the 1-bit state output of the comparators only during a monitoring time interval. In the case of FIG. 16, a monitoring time interval takes place whenever the common side of the capacitors 162 is connected to Vss through the switch 165-1. One way to achieve this is by a dedicated, short duration, monitoring time interval that is not a load time interval, during which the switch 165-1 is closed and all the load switches 163A and 163B are disconnected.

Another way to achieve this is without using a dedicated monitoring time interval, but rather whenever a load time interval happens to also be a monitoring time interval. Because the control logic is aware of the network connection at any moment, it can be known, at any time interval, whether that time interval is suitable for monitoring or not (that is, whether is the switch 165-1 closed or not). Although a monitoring time interval does not take place during a load time interval, a monitoring time interval takes place from time to time as a consequence of the selection algorithm. Because the control logic is aware of this fact, it is possible to monitor the 1-bit state of the comparators. It is to be noted that with the circuit of FIG. 16, once a monitoring time interval takes place, the 1-bit state of all capacitors can be monitored at once. At load time intervals between two monitoring time intervals, the state of each capacitor can be estimated according to knowledge of the network parameters. In the case of targeted capacitors selection algorithm, the best estimate of the 1-bit state of a capacitor is that the 1-bit state toggles after each time interval during which the capacitor is used.

Figure 17:
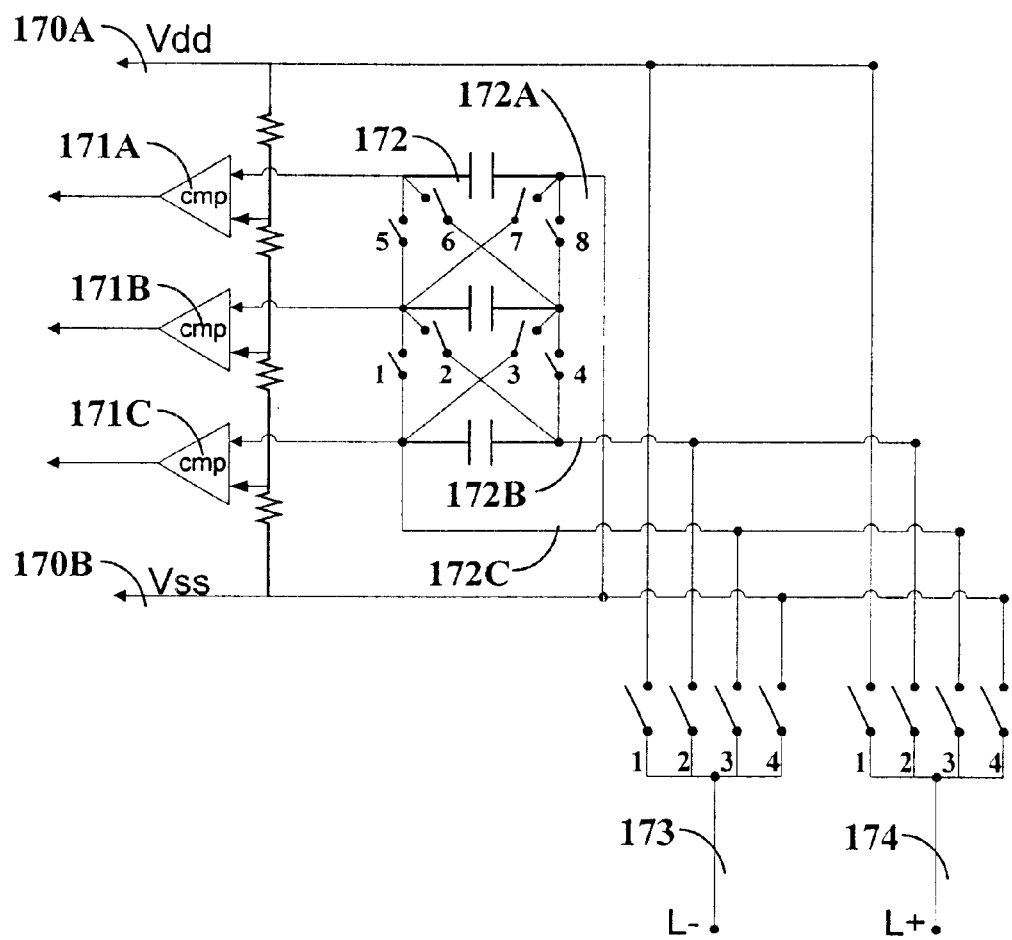
FIG. 17 shows a block diagram of a more versatile implementation of an embodiment of the network of switched capacitors according to the present invention, suitable for the targeted capacitors selection algorithm, and capable of generating $2^{(N+1)}$ quantization levels where output is floating.

Implementation of an $1+2^{(N+1)}$ Level Quantizer Network using N Capacitors and the Targeted Capacitors Selection Algorithm FIG. 17 shows an embodiment of a network of switched capacitors that is capable of implementing the network connections needed to fully support the $1+2^{(N+1)}$ level quantizer case described above. In this network, a top capacitor 172 has a target voltage $(V_{dd}-V_{ss})*2^{-1}$ and one side of this capacitor is permanently connected to $V_{ss}$. The other two capacitors have target voltages $(V_{dd}-V_{ss})*2^{-2}$ and $(V_{dd}-V_{ss})*2^{-3}$, respectively. In this network the voltage at load terminals 173 and 174 is floating, and not all the 1-bit states are available for monitoring at all times. The 1-bit state from a comparator 171B can be measured only when a switch 172-8 is closed. The 1-bit state from comparator 171C can be measured only when both switches 172-8 and 172-4 are closed. These conditions specify a monitoring time interval, which can be treated according to one of the methods described above. As before, a resistor voltage-divider network extends from a voltage $V_{dd}$ 170A to a voltage $V_{ss}$ 170B. Voltage $V_{dd}$ 170A and voltage $V_{ss}$ 170B, in addition to a voltage 172A, a voltage 172B, and a voltage 172C, are input to switches 173 and 174.

In order to be able to monitor all the 1-bit states at any time, the comparators 171B and 171C can be connected to their respective capacitors through a floating differential buffer, similar to the case of FIG. 18, described below.

Figure 18:
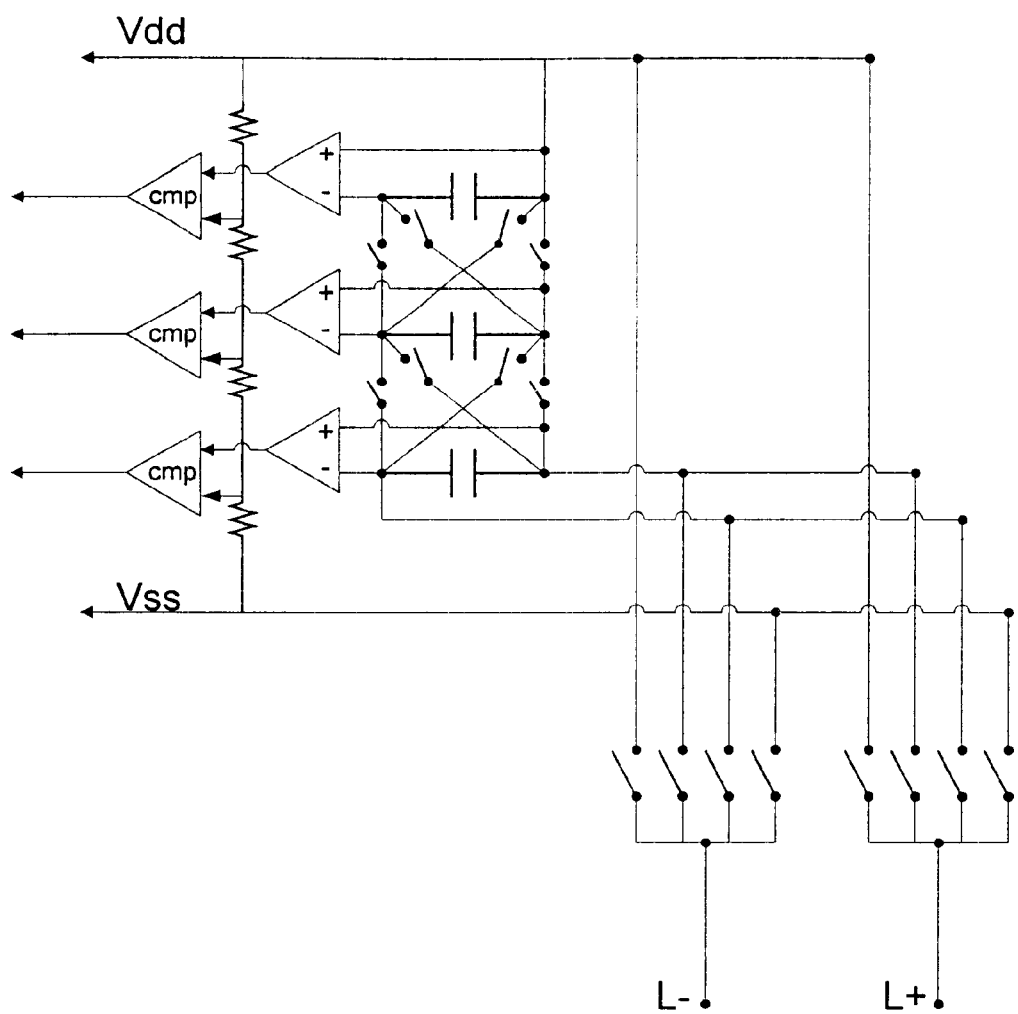
FIG. 18 shows an embodiment similar to that of FIG. 17, capable of generating an output that is always referenced to $V_{ss}$, and where capacitors are floating.

FIG. 18 illustrates yet another embodiment of a network that is capable of implementing the $1+2^{(N+1)}$ level quantizer. Here, the top capacitor has a target voltage $(V_{dd}-V_{ss})*2^{-1}$, and one side of this capacitor is permanently connected to $V_{dd}$. This network allows for the voltage at the load terminals to be always referenced to $V_{ss}$. All capacitors are floating, and therefore must be connected to the comparators via differential buffers, as illustrated.

Figure 19:
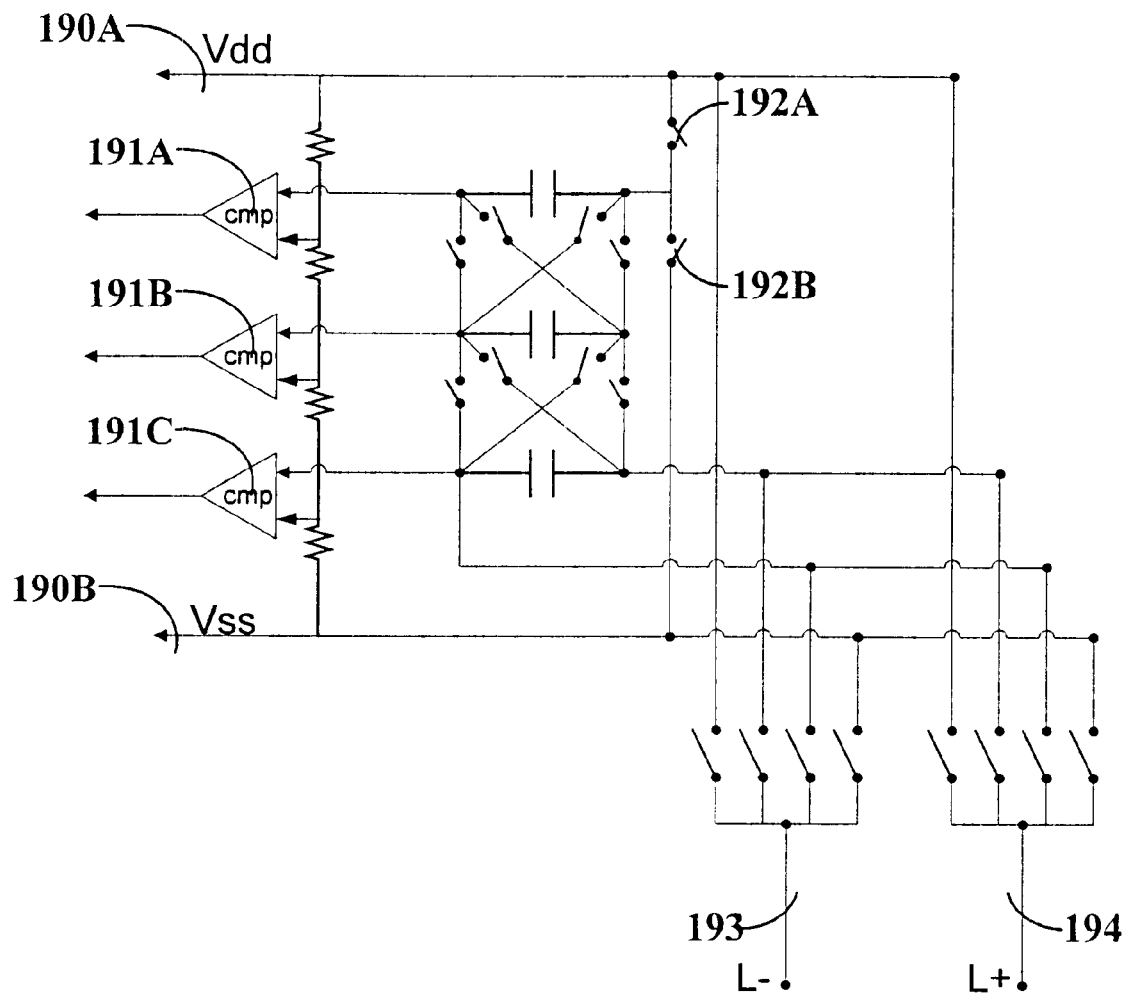
FIG. 19 shows no embodiment similar to that of FIG. 17 and 18, capable of generating an output that is always referenced to $V_{ss}$, and where a network connection can be made where capacitors are referenced to $V_{ss}$.

In FIG. 19, two switches 192A and 192B are added, which allow connecting the top capacitor either to $V_{dd}$ or to $V_{ss}$. The voltage at load terminals 193 and 194 is always referenced to $V_{ss}$. Switches 192A and 192B permit periodically connecting one side of all capacitors to $V_{ss}$ for monitoring, and avoids the need for differential buffers to monitor the capacitors.

Implementation of the Control Logic

An embodiment of control logic suitable for the embodiments of the present invention illustrated in FIGS. 17–19 is described here by way of a non-limiting example. All these embodiments implement the targeted capacitors selection algorithm, and use a 1-bit state to describe the state of each capacitor. The control logic is also aware of the target voltage of each capacitor, for example by their order. The control logic relates to the network of switched capacitors as a quantizer with $2^{(N+1)}$ quantization levels, capable of producing an output voltage of the form $\pm K*(V_{dd}-V_{ss})/(2^{(N+1)})$. Thus, the first action performed by the control logic is to determine which of the possible quantization levels minimizes the target function. The second action is to determine the network connection that will give rise to this quantization level, while conforming to the targeted capacitor selection algorithm, given the 1-bit state of each capacitor. Two possible implementations of this second action are given here as non-limiting examples. The first possibility is to perform, in real time, the algorithm described in the $2^{(N+1)}$ level quantizer proof, as detailed previously. The second possibility is to use a pre-computed lookup table. Taking the N+1 bit binary representation of the quantization level found in step one above, and concatenating thereto the N 1-bit states from all capacitors will result in a 2*N+1 bit integer. This integer can be used to index a lookup table, where, at each entry of the lookup table is the pre-computed $A_n$ parameters described previously, corresponding to the respective quantization level and 1-bit states.

Network State Initialization

In general, the initial conditions of the network state will not be those of the steady state. For example, in the case of targeted capacitors selection algorithm, the initial voltage on each capacitor may be far from the target voltage. In the case of the targeted capacitors selection algorithm, after a short time the network of switched capacitors will reach steady-state, where the voltage over each capacitor is close to the respective target voltage. During this short time the target error will be much larger than during the steady state. For example, if all capacitors are initially completely discharged, the targeted capacitors selection algorithm will only let the capacitors charge until they reach their target voltage. In cases where this initial short time must be minimized, it is possible to pre-charge the capacitors to some good initial conditions.

While the invention has been described with respect to a limited number of embodiments, it will be appreciated that many variations, modifications and other applications of the invention may be made.

What is claimed is:

1. A power amplifier receiving electrical energy from a primary source of electrical energy having a $V_{ss}$ source voltage and a $V_{dd}$ source voltage, the power amplifier receiving a first input signal via a first input terminal and supplying a power output signal via load terminals, the power amplifier comprising a control logic unit having a control input and control outputs, and a network of switched capacitors containing at least one capacitor for storing electrical energy, each of said at least one capacitor having a voltage thereon, wherein said network of switched capacitors is operative to configuring electrical circuits between the load terminals, and wherein said electrical circuits include at least one member selected from a group containing:

(a) the $V_{ss}$ source voltage;

(b) the $V_{dd}$ source voltage; and (c) a non-negative number of capacitors of said network of switched capacitors;

and said control logic unit is operative to controlling said network of switched capacitors, wherein said control logic unit is responsive to a selection algorithm and is furthermore responsive to at least one signal taken from a group containing:

(d) said control input;

(e) the $V_{ss}$ source voltage;

(f) the $V_{dd}$ source voltage;

(g) an estimate of the $V_{ss}$ source voltage;

(h) an estimate of the $V_{dd}$ source voltage;

(i) a voltage on said at least one capacitor; and (j) an estimate of a voltage on said at least one capacitor, and wherein said control logic unit is operative to creating a voltage difference at the load terminals.

2. The power amplifier of claim 1, further comprising an analog power stage having supply terminals for receiving a supply voltage, a second input terminal for receiving a second input signal, and power output terminals, and wherein said supply terminals are connected to said load terminals.

3. The power amplifier of claim 1, further comprising a noise-shaping loop having a second input terminal, a third input terminal, and an output terminal for supplying a shaped signal, wherein said second input terminal receives the first input signal, wherein said third input terminal receives a signal taken from a group containing:

(k) said voltage difference at the load terminals, and (l) an estimate of said voltage difference at the load terminals, and wherein said shaped signal is said control input.

4. The power amplifier of claim 2, further comprising a noise-shaping loop having a third input terminal, a fourth input terminal, and an output terminal for supplying a shaped signal, wherein said third input terminal receives the first input signal, wherein said fourth input terminal receives a signal taken from a group containing:

(k) the voltage difference at said power output terminals, and (l) an estimate of the voltage difference at said power output terminals, and wherein said shaped signal is said control input and is said second input signal to said analog power stage.

5. The power amplifier of claim 1, furthermore comprising at least one target voltage, and wherein said estimate of a voltage on said at least one capacitor is determined by a comparison of the voltage on said at least one capacitor with said at least one target voltage.

6. The power amplifier of claim 2, furthermore comprising at least one target voltage, and wherein said estimate of a voltage on said at least one capacitor is determined by a comparison of the voltage on said at least one capacitor with said at least one target voltage.

7. The power amplifier of claim 5, wherein said network of switched capacitors has a state, and wherein an estimate of said voltage difference at the load terminals is calculated according to said estimate of a voltage on said at least one capacitor and said state of said network of switched capacitors.

8. The power amplifier of claim 6, wherein said network of switched capacitors has a state, and wherein an estimate of said voltage difference at the load terminals is calculated according to said estimate of a voltage on said at least one capacitor and said state of said network of switched capacitors.

9. The power amplifier of claim 5, wherein said at least one capacitor includes N capacitors $C_1 \ldots C_N$, where N is a positive integer, wherein said at least one target voltage includes N target voltages $T_1 \ldots T_N$ distributed between the $V_{ss}$ source voltage and the $V_{dd}$ source voltage such that for a positive integer n not exceeding N:

$$T_n = V_{ss} + n*(V_{dd} - V_{ss})/(N+1);$$

and wherein said selection algorithm is operative to keeping the voltage on each of said capacitor $C_n$ close to said target voltage $T_n$.

10. The power amplifier of claim 6, wherein said at least one capacitor includes N capacitors $C_1 \ldots C_N$, where N is a positive integer, wherein said at least one target voltage includes N target voltages $T_1 \ldots T_N$ distributed between the $V_{ss}$ source voltage and the $V_{dd}$ source voltage such that for a positive integer n not exceeding N:

$$T_n = V_{ss} + n*(V_{dd} - V_{ss})/(N+1);$$

and wherein said selection algorithm is operative to keeping the voltage on each of said capacitor $C_n$ close to said target voltage $T_n$.

11. The power amplifier of claim 5, wherein said at least one capacitor includes N capacitors $C_1 \ldots C_N$, where N is a positive integer, wherein said at least one target voltage includes N target voltages $T_1 \ldots T_N$ distributed such that for a positive odd interger M and for a positive integer n not exceeding N:

$$T_n = V_{ss} + M*2^{-n}*(V_{dd} - V_{ss});$$

and wherein said selection algorithm is operative to keeping the voltage on each of said capacitor $C_n$ close to said target voltage $T_n$.

12. The power amplifier of claim 6, wherein said at least one capacitor includes N capacitors $C_1 \ldots C_N$, where N is a positive integer, wherein said at least one target voltage includes N target voltages $T_1 \ldots T_N$ distributed such that for a positive odd integer M and for a positive integer n not exceeding N:

$$T_n = V_{ss} + M*2^{-n}*(V_{dd} - V_{ss});$$

and wherein said selection algorithm is operative to keeping the voltage on each of said capacitor $C_n$ close to said target voltage $T_n$.

13. The power amplifier of claim 3, wherein said noise-shaping loop has a transfer function, and wherein said transfer function is selected according to a human auditory sensitivity filter.

14. The power amplifier of claim 4, wherein said noise-shaping loop has a transfer function, and wherein said transfer function is selected according to a human auditory sensitivity filter.

15. The power amplifier of claim 9, further comprising a noise-shaping loop having a second input terminal for receiving the first input signal, a feedback terminal for receiving a feedback, and a shaped signal terminal for supplying a shaped signal, wherein said feedback is taken from a group containing:

(k) said voltage difference at the load terminals, and (l) an estimate of said voltage difference at the load terminals;

and wherein said shaped signal is said control input.

16. The power amplifier of claim 10, further comprising a noise-shaping loop having a third input terminal for receiving the first input signal, a feedback terminal for receiving a feedback, and a shaped signal terminal for supplying a shaped signal, wherein said feedback is taken from a group containing:

(k) the voltage difference at said power output terminals, and (l) an estimate of the voltage difference at said power output terminals;

and wherein said shaped signal is said control input and is said second input signal to said analog power stage.

17. The power amplifier of claim 11 further comprising a noise-shaping loop having a second input terminal for receiving an input, a feedback terminal for receiving a feedback, and an output terminal for supplying a shaped signal, wherein said second input terminal receives the first input signal, wherein said feedback is taken from a group containing:

(k) said voltage difference at the load terminals, and (l) an estimate of said voltage difference at the load terminals, and wherein said shaped signal is the control input.

18. The power amplifier of claim 12 further comprising a noise-shaping loop having a third input terminal for receiving an input, a feedback terminal for receiving a feedback, and an output terminal for supplying a shaped signal, wherein said third input terminal receives the first input signal, wherein said feedback is taken from a group containing:

(k) the voltage difference at said power output terminals, and (l) an estimate of the voltage difference at said power output terminals, and wherein said shaped signal is said control input and is said second input signal to said analog power stage.

* * * * *